(12) United States Patent
Yamauchi et al.

(10) Patent No.: US 10,686,674 B2
(45) Date of Patent: Jun. 16, 2020

(54) INFORMATION PROCESSING APPARATUS, AND INSTALLATION LOCATION DETERMINATION METHOD

(71) Applicant: FUJITSU LIMITED, Kawasaki-shi, Kanagawa (JP)

(72) Inventors: Hiromasa Yamauchi, Kawasaki (JP); Teruhisa Ninomiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 9 days.

(21) Appl. No.: 15/987,314

(22) Filed: May 23, 2018

(65) Prior Publication Data

US 2018/0343173 A1    Nov. 29, 2018

(30) Foreign Application Priority Data

May 25, 2017    (JP) .................................. 2017-103698

(51) Int. Cl.
*G09G 5/00*    (2006.01)
*H04L 12/24*    (2006.01)
(Continued)

(52) U.S. Cl.
CPC .............. *H04L 41/22* (2013.01); *G06F 30/00* (2020.01); *G06F 30/13* (2020.01); *G06F 30/18* (2020.01);
(Continued)

(58) Field of Classification Search
CPC ................. G09G 5/14; G09G 2340/10; G09G 2340/125; G06T 11/60; G06T 15/50
(Continued)

(56) References Cited

U.S. PATENT DOCUMENTS

2011/0029098 A1*    2/2011    Fukuda ............ G05B 19/41885
                                                                              700/13
2011/0153279 A1*    6/2011    Zhang ................. G06F 17/5004
                                                                              703/1

FOREIGN PATENT DOCUMENTS

JP    06-290226    10/1994
JP    08-129655    5/1996
JP    2000-123198    4/2000

OTHER PUBLICATIONS

Jozam, J. M., Smart home design: spatial preference modeling of smart homes, Citation for published version (APA): (2016). Technische Universiteit Eindhoven. [online], [Retrieved on Jul. 26, 2019]. Retrieved from the Internet: <URL: https://pure.tue.nl/ws/files/25509290/20160629_Heidari_Jozann.pdf> (Year: 2016).*

* cited by examiner

*Primary Examiner* — Gordon G Liu
(74) *Attorney, Agent, or Firm* — Fujitsu Patent Center

(57) ABSTRACT

An information processing apparatus includes, a memory that stores location information of a plurality of objects to be arranged within a three-dimensional space, and a processor. The processor performs a process. The process includes, generating first image data of the plurality of objects based on the location information, outputting the first image data to a display, determining a display plane including a location corresponding to one point of the first image, generating second image data which includes a display plane image and installation candidate marks, outputting the second image data to the display, determining whether a surface corresponding to any one of the installation candidate marks has been selected according to an inputted selection instruction, and determining the installation location of the wireless device based on the location corresponding to one point of the first image, and a location of the selected surface.

8 Claims, 23 Drawing Sheets

(51) Int. Cl.
*H04W 24/06* (2009.01)
*G06T 17/10* (2006.01)
*H04W 16/20* (2009.01)
*H04W 24/02* (2009.01)
*G06F 30/00* (2020.01)
*G06F 30/13* (2020.01)
*G06F 30/18* (2020.01)
*G06F 30/367* (2020.01)
*H04B 17/391* (2015.01)

(52) U.S. Cl.
CPC ............ *G06F 30/367* (2020.01); *G06T 17/10* (2013.01); *H04L 41/145* (2013.01); *H04W 16/20* (2013.01); *H04W 24/02* (2013.01); *H04W 24/06* (2013.01); *H04B 17/3912* (2015.01)

(58) Field of Classification Search
USPC ........................................................ 345/629
See application file for complete search history.

FIG. 4A  401

| OBJECT ID | COORDINATE | MATERIAL ID |
|---|---|---|
| OB00000 | (x00,y00,z00), (x10,y10,z10), (x20,y20,z20) (x30,y30,z30) | M00/M00 |
| OB00001 | (x01,y01,z01), (x11,y11,z11) (x21,y21,z21) (x31,y31,z31) | M01/M01 |
| ... | ... | ... |

FIG. 4B  402

| DEVICE ID | COORDINATE | ANTENNA ID | TRANSMISSION FREQUENCY | TRANSMISSION POWER | TILT ANGLE | ORIENTED DIRECTION |
|---|---|---|---|---|---|---|
| DV00000 | (x3,y3,z0) | AN00 | f0 | P0 | t0 | D0 |
| DV00001 | (x4,y4,z4) | AN01 | f1 | P1 | t1 | D1 |
| ... | ... | ... | ... | ... | ... | ... |

FIG. 4C  403

| MATERIAL ID | THICKNESS | ELECTRIC CHARACTERISTIC |
|---|---|---|
| M00 | T0 | $\varepsilon 0, \rho 0, \cdots$ |
| M01 | T1 | $\varepsilon 1, \rho 1, \cdots$ |
| ... | ... | ... |

FIG. 4D  404

| ANTENNA ID | DIRECTIVITY |
|---|---|
| AN00 | $\theta 0, \varphi 0$ |
| AN01 | $\theta 1, \varphi 1$ |
| ... | ... |

FIG. 4E  405

| APPLICATION ID | RECOMMENDED INSTALLATION SURFACE |
|---|---|
| AP00 | S0 |
| AP01 | S1 |
| ... | ... |

FIG. 4F  406

| APPLICATION ID | INSTALLATION SURFACE NUMBER | SEPARATION DISTANCE |
|---|---|---|
| AP00 | 2 | D0 |
| AP01 | 4 | D1 |
| ... | ... | ... |

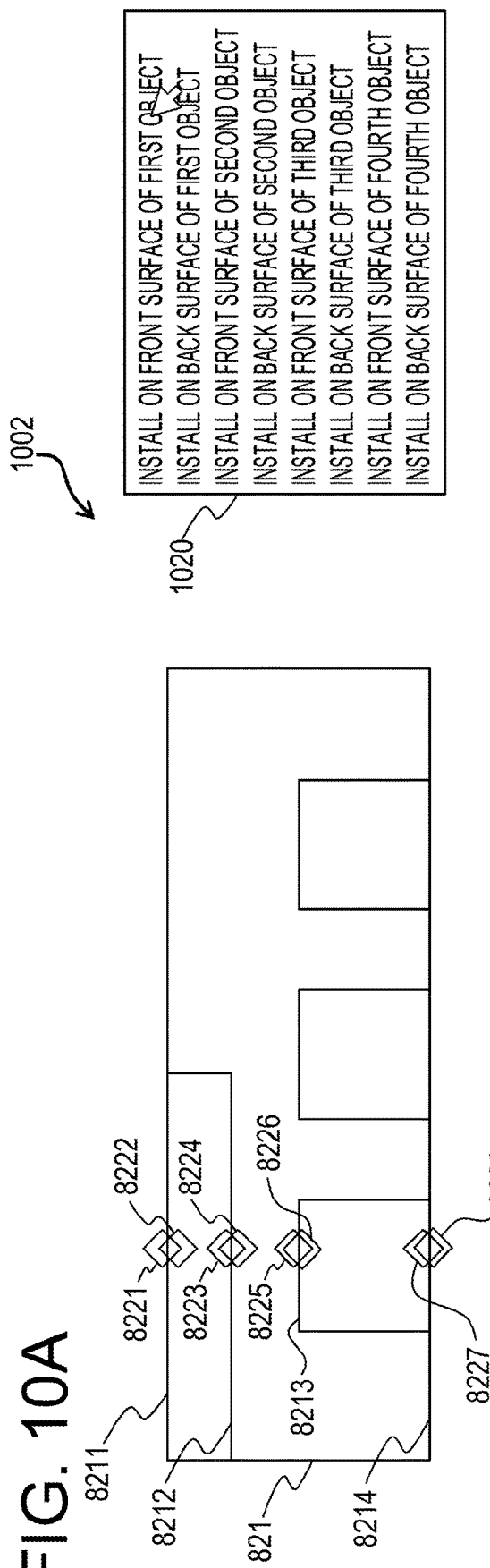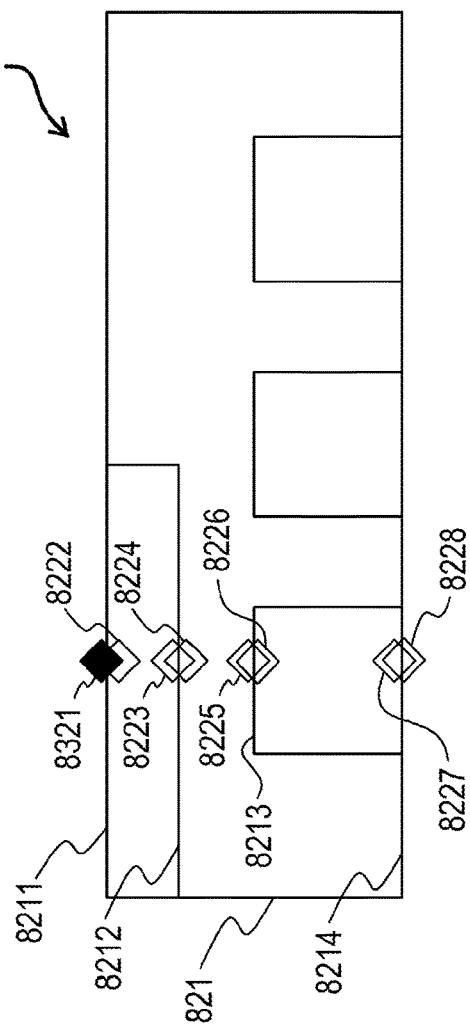

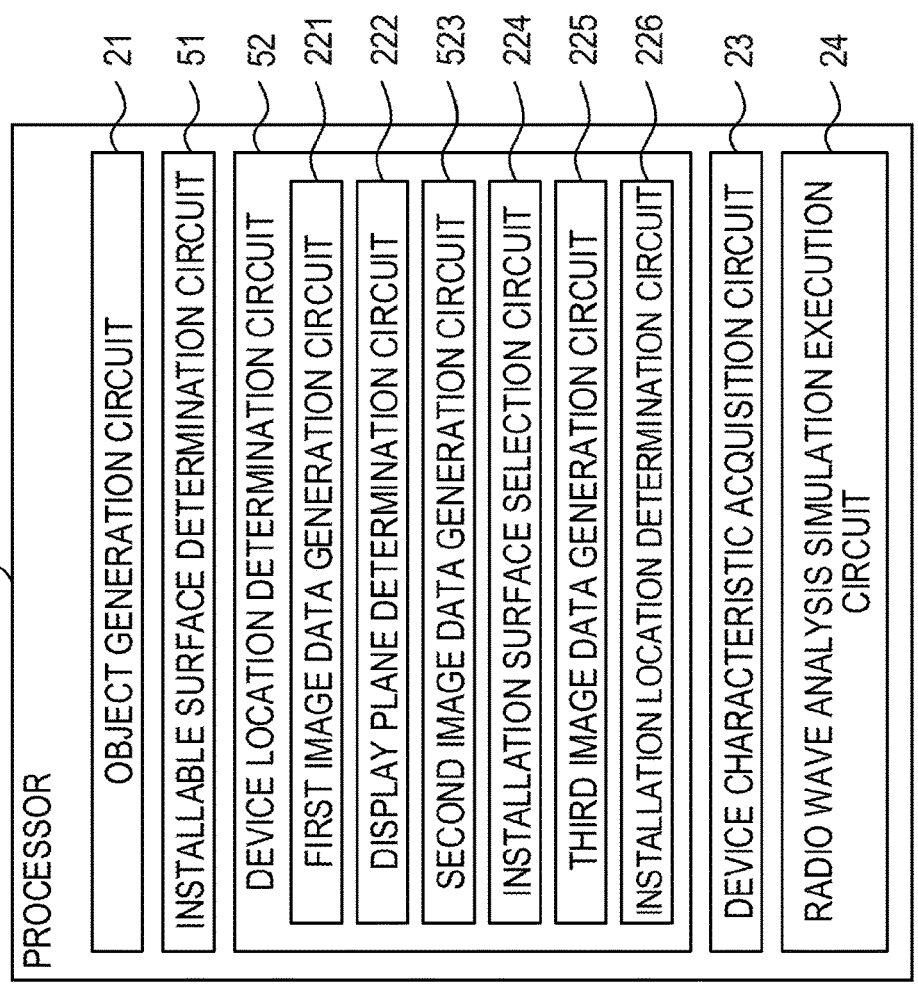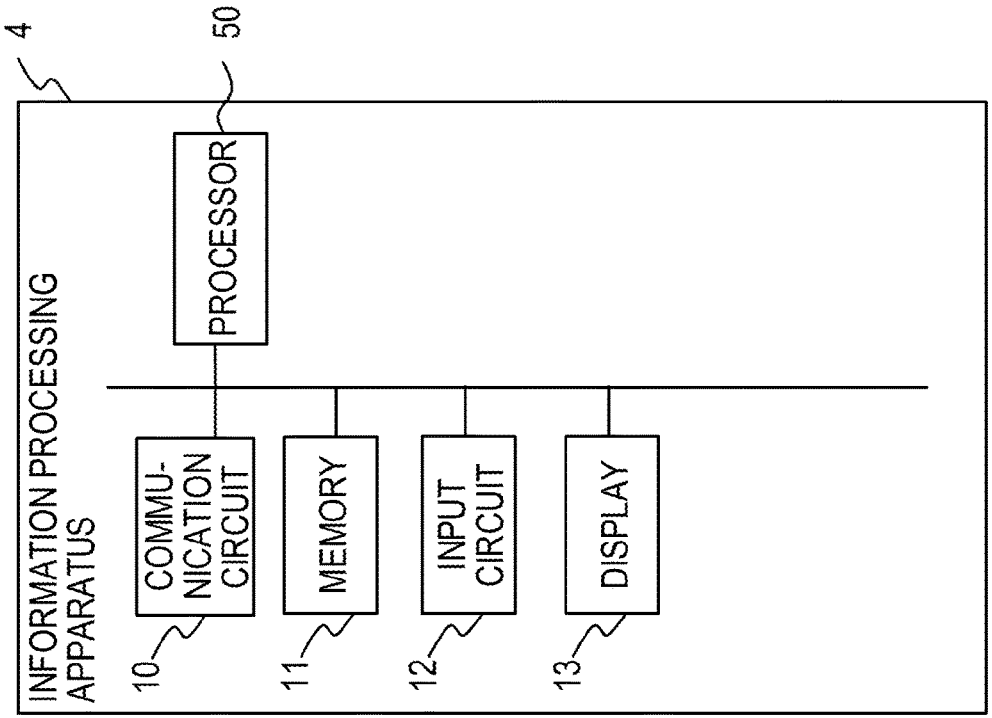

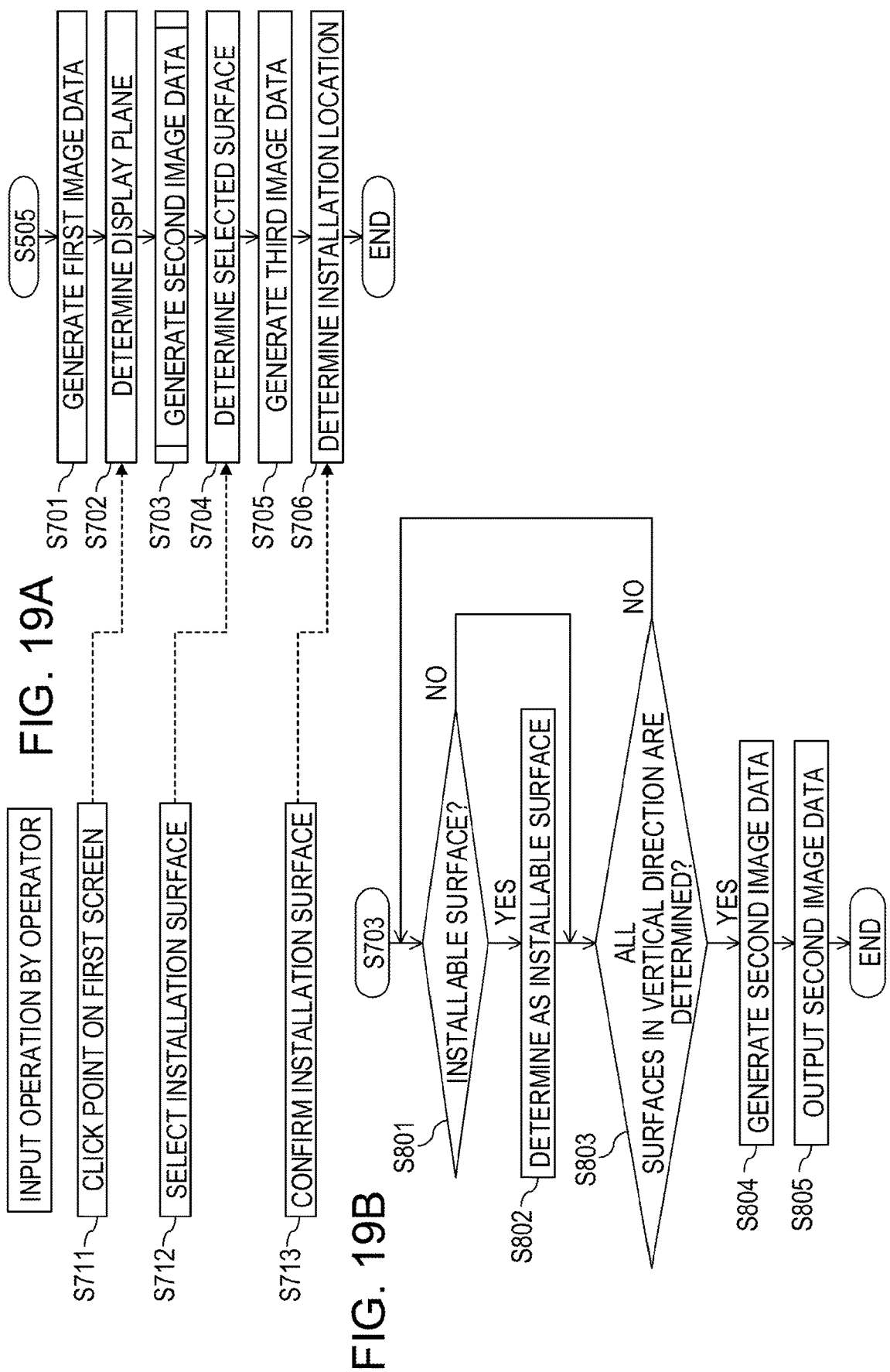

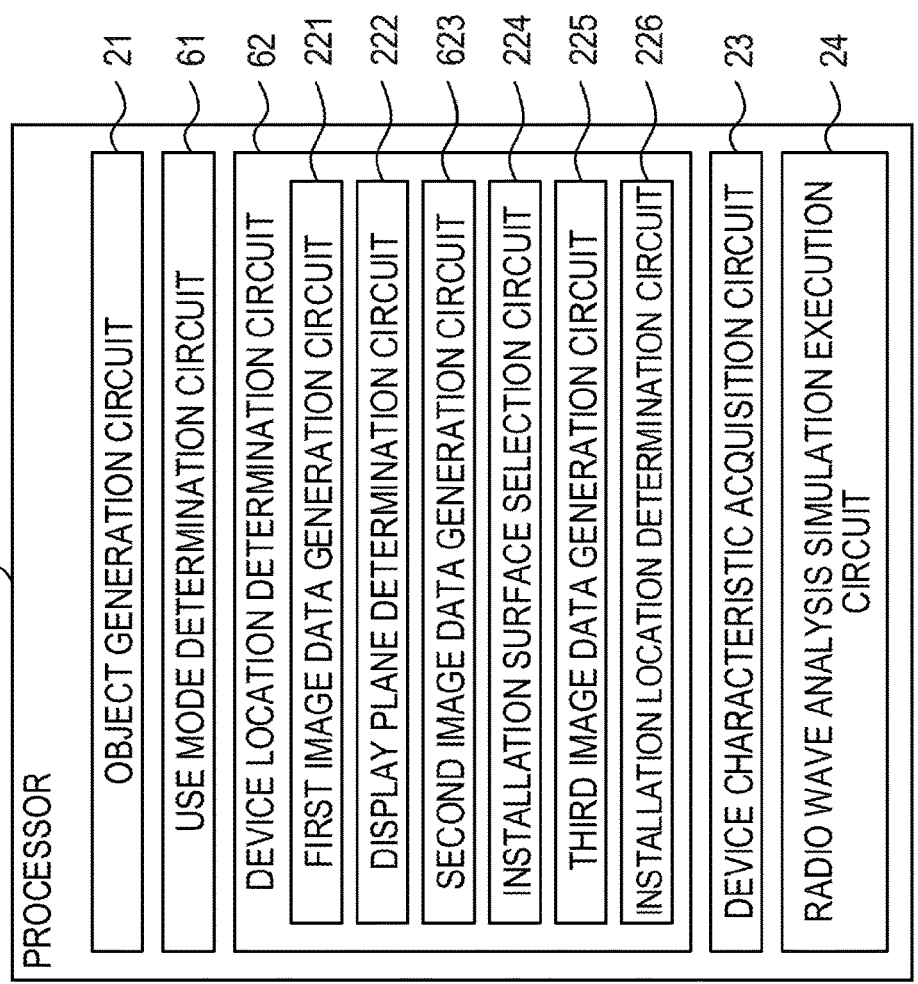
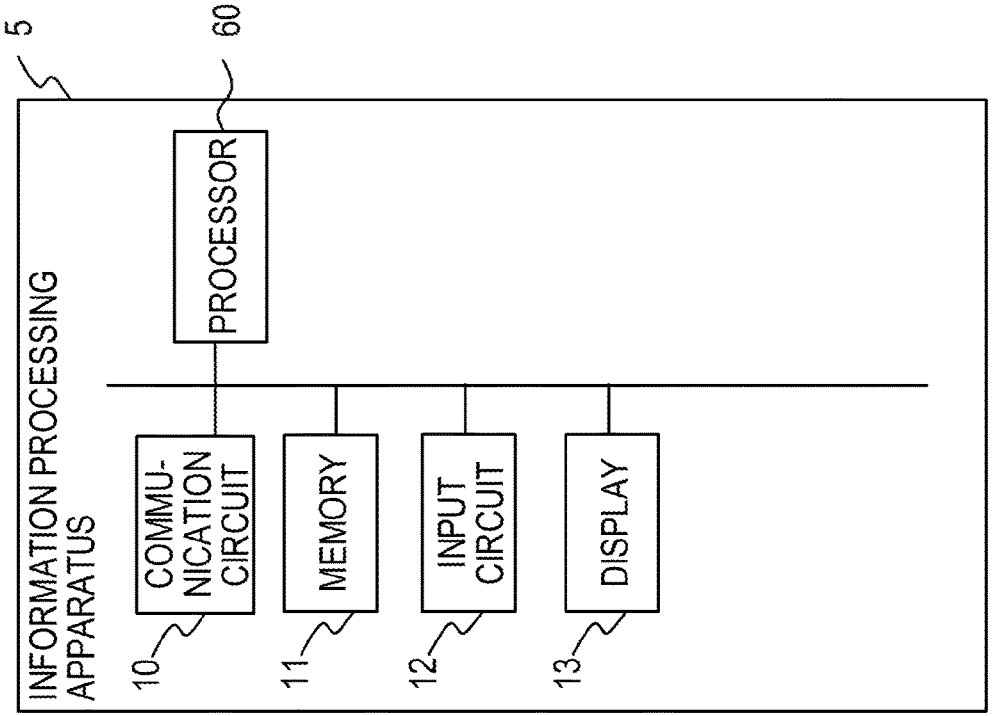

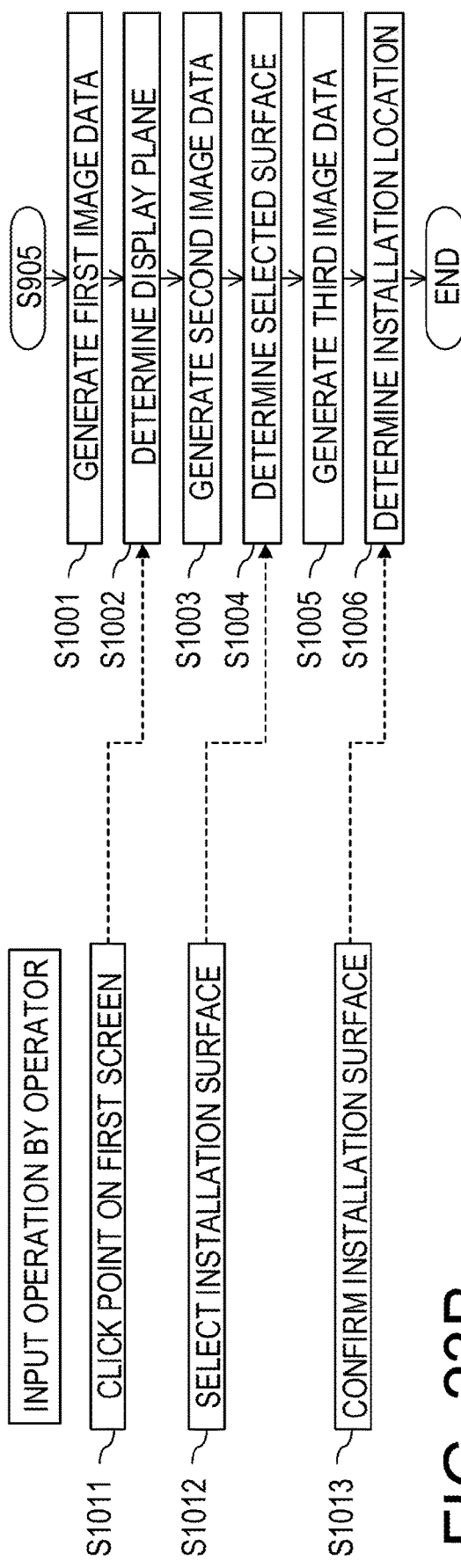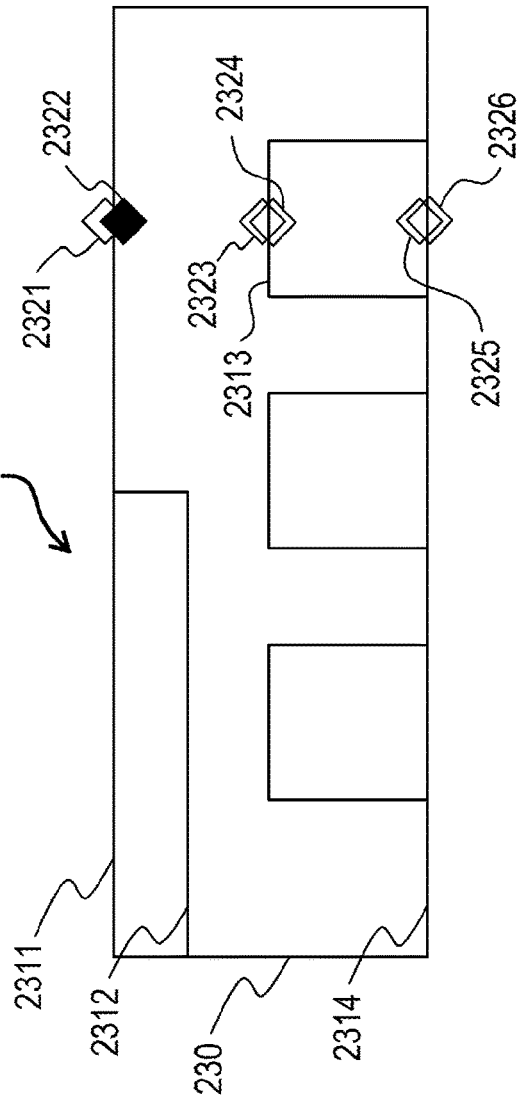

US 10,686,674 B2

INFORMATION PROCESSING APPARATUS, AND INSTALLATION LOCATION DETERMINATION METHOD

CROSS-REFERENCE TO RELATED APPLICATION

This application is based upon and claims the benefit of priority of the prior Japanese Patent Application No. 2017-103698, filed on May 25, 2017, the entire contents of which are incorporated herein by reference.

FIELD

The embodiments discussed herein are related to an information processing apparatus of determining an installation location of a wireless device, an installation location determination program of determining the installation location of the wireless device, and a method thereof.

BACKGROUND

There has been known a technology of displaying an object to be arranged by displaying a depth direction of the object and performing an interference check so that a plurality of objects is not arranged within the same space when the object is edited within a virtual three-dimensional space (see, e.g., Japanese Laid-Open Patent Publication No. 08-129655). According to such a technology, it becomes possible to easily and efficiently execute editing such as arrangement, movement, rotation, and alignment of an object within a virtual three-dimensional space while visually recognizing the editing on a two-dimensional display.

Also, there has been known a technology of making the color of a designated activated drawing opposite to other overlapping drawings when the designated activated drawing partially overlaps with other drawings in an element such as a line segment, (see, e.g., Japanese Laid-Open Patent Publication No. 06-290226). According to such a technique, in performing designing and plotting using the CAD, even when there exists a drawing overlapping with a designated activated drawing, it is easy to distinguish the drawings from each other, thereby improving the operability of the CAD.

Further, there has been known a technology of asking for a radio interference situation based on information on the location, height, and shape of a predetermined building, and the location of a given radio wave source using data stored in a three-dimensional city database (see, e.g., Japanese Laid-Open Patent Publication No. 2000-123198). According to such a technique, it becomes possible to perform a more precise simulation by considering a radio wave diffraction of a building in the height direction, and considering a radio wave interference over the entire side face of the building.

Related technologies are disclosed in, for example, Japanese Laid-Open Patent Publication Nos. 08-129655, 06-290226, and 2000-123198.

SUMMARY

According to an aspect of the embodiments, an information processing apparatus includes a memory that stores location information indicating locations of a plurality of objects to be arranged within a three-dimensional space, and a processor coupled to the memory. The processor performs a process. The process includes generating first image data indicating a first image including the plurality of objects based on the location information, outputting the first image data to a display, determining a display plane including a location corresponding to one point of the first image, according to a first inputted selection instruction, generating second image data indicating a second image which includes a display plane image and installation candidate marks, and outputting the second image data to the display, the display plane image including the plurality of objects included in the display plane, and the installation candidate marks being arranged to be superimposed on the display plane image and indicating surfaces of the plurality of objects selectable as an installation location of a wireless device, determining whether a surface corresponding to any one of the installation candidate marks has been selected according to a second inputted selection instruction, and determining the installation location of the wireless device based on the location corresponding to one point of the first image and a location of the selected surface.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 4A to 4F are views illustrating examples of tables stored in a memory, FIG. 4A illustrates a layout table, FIG. 4B illustrates a device table, FIG. 4C illustrates a material table, and FIG. 4D illustrates an antenna table. FIG. 4E illustrates an application table, and FIG. 4F illustrates an installation-related table;

FIG. 10A is a view illustrating an example of a second image corresponding to second image data generated by a second image data generation circuit illustrated in FIG. 9B, and FIG. 10B is a view illustrating an example of a third image corresponding to third image data generated by a third image data generation circuit illustrated in FIG. 9B;

FIG. 16A is a circuit block diagram of an information processing apparatus of executing an installation location determination process, according to a fourth embodiment, and FIG. 16B is a functional block diagram of a processor illustrated in FIG. 16A;

FIG. 19A is a more detailed flow chart of the processing described in S505 illustrated in FIG. 17, and FIG. 19B is a more detailed flow chart of the processing in S703 illustrated in FIG. 19A;

FIG. 21A is a circuit block diagram of an information processing apparatus of executing an installation location determination process, according to a fifth embodiment, and FIG. 21B is a functional block diagram of a processor illustrated in FIG. 21A;

FIG. 23A is a more detailed flow chart of the processing described in S905 illustrated in FIG. 22, and FIG. 23B is a view illustrating an example of a second image.

DESCRIPTION OF EMBODIMENTS

When a radio wave analysis simulation is performed on a wireless device disposed, for example, indoors, an operation of arranging the wireless device within a layout model such as a CAD model is performed by an operator. For example, the operator may determine horizontal coordinates of an installation location of the wireless device by designating a desired point in a two-dimensional image such as a plan perspective view of a building, and determine vertical coordinates of the installation location of the wireless device by using a separately displayed Z coordinate input screen. The operator may click an installation point on a layout screen using a three-dimensional CAD image, thereby determining the coordinates of a location where the wireless device is to be installed.

However, when several tens to several hundreds of wireless device are disposed and a radio wave analysis simulation is executed, there is a concern that an operation of individually determining installation locations of the wireless device may become complicated. For example, in a method of using a two-dimensional image, there is a concern that an operator may wrongly input Z coordinates and then set an installation location to a location where no wireless device is installed, such as the inside of a ceiling and a pillar. Thus, every time the installation location of the wireless device is determined, the operator confirms the installation location using a three-dimensional image. In a method using the three-dimensional image, it is possible to arrange a wireless device only in an area included in a display screen on a display. Thus, the operator executes operations such as movement, rotation, and enlargement of the area included in the display screen numerous times. In any of the method using the two-dimensional image and the method using the three-dimensional image, the number of times of operation by the operator, such as movement, rotation, and enlargement, increases according to an increase of the number of wireless device to be installed and an expansion of an installation area. Thus, an operation of defining the installation location of the wireless device becomes complicated.

Hereinafter, descriptions will be made on an information processing apparatus, an installation location determination program, and a method thereof, according to embodiments of the present disclosure with reference to the accompanying drawings. However, the technical scope of the present disclosure is not limited to the embodiments.

(Information Processing Apparatus Related to Information Processing Apparatus According to Embodiment)

Prior to description on the information processing apparatus according to the embodiment, the operation of the information processing apparatus related to the information processing apparatus according to the embodiment will be described.

Figure 1A:
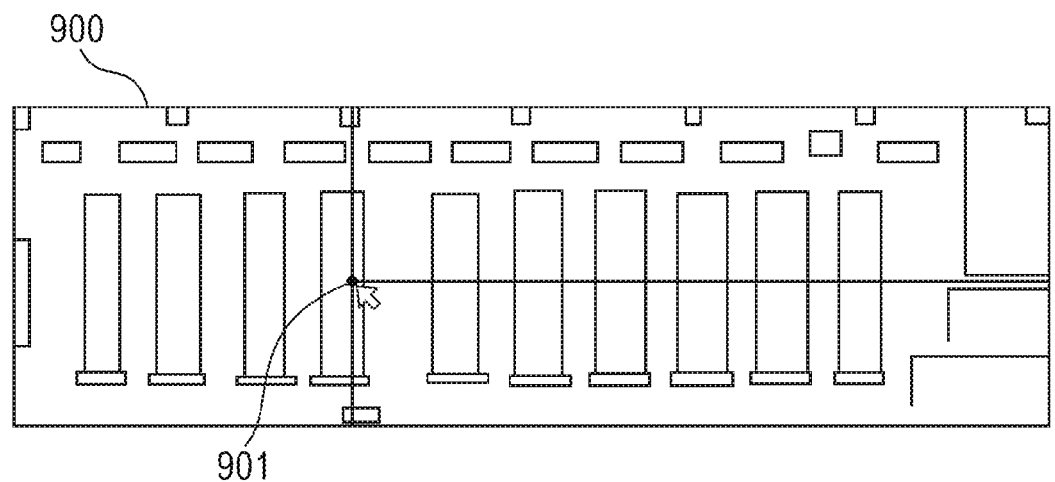
FIG. 1A is a view illustrating a first screen when an installation location of a wireless device is determined using a two-dimensional image.
Figure 1B:
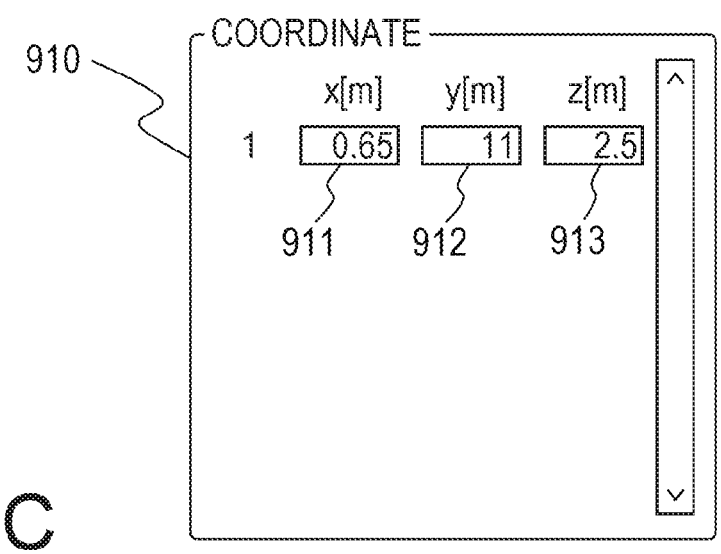
FIG. 1B is a view illustrating a second screen displayed subsequently to the first screen.
Figure 1C:
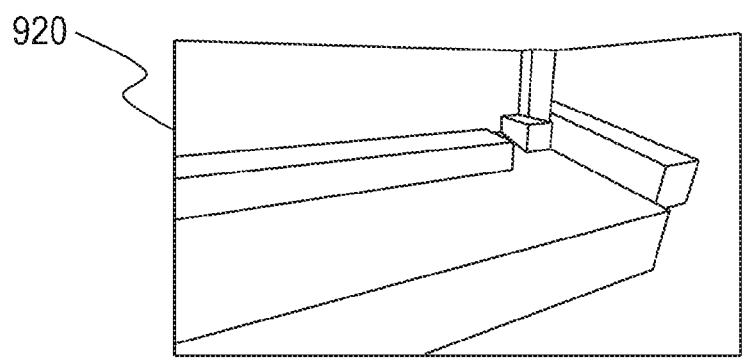
FIG. 1C is a view illustrating a third screen displayed subsequently to the second screen.

FIG. 1A is a view illustrating a first screen when an installation location of a wireless device is determined using a two-dimensional image, FIG. 1B is a view illustrating a second screen displayed subsequently to the first screen, and FIG. 1C is a view illustrating a third screen displayed subsequently to the second screen. A radio wave propagation analysis tool which includes an information processing apparatus of determining an installation location of a wireless device using a two-dimensional image is, for example, RapLab, EEM-RTM, or iBwave.

In a method using a two-dimensional image, first, an operator (not illustrated) may click a desired point 901 of a plan perspective view 900 displayed on a display, so as to determine horizontal coordinates of an installation location of a wireless device subsequently, the operator determines vertical coordinates of the installation location of the wireless device using a Z coordinate input screen 910 where a Z coordinate 913 is displayed together with an X coordinate 911 and a Y coordinate 912 corresponding to the determination in the plan perspective view 900 such that input of the Z coordinate 913 is possible. Then, the operator confirms the installation location of the wireless device using a three-dimensional image 920 whenever determining the installation location of the wireless device. The operation of confirming the installation location of the wireless device by the operator becomes complicated since the operator executes operations such as movement, rotation, and enlargement of the area of the three-dimensional image included in the display screen numerous times by operating, for example, a mouse.

Figure 2A:
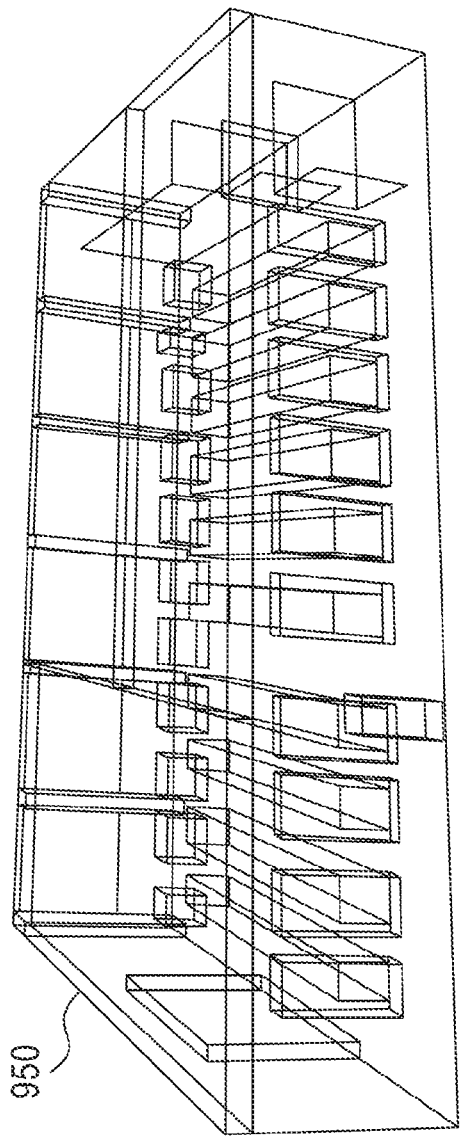
FIG. 2A is a view illustrating a first screen when an installation location of a wireless device is determined using a three-dimensional image.
Figure 2C:
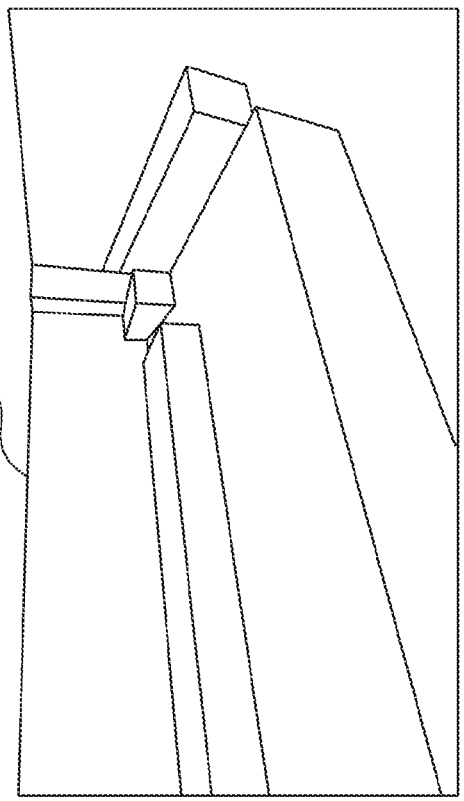
FIG. 2C is a view illustrating a third screen displayed subsequently to the second screen.
Figure 2B:
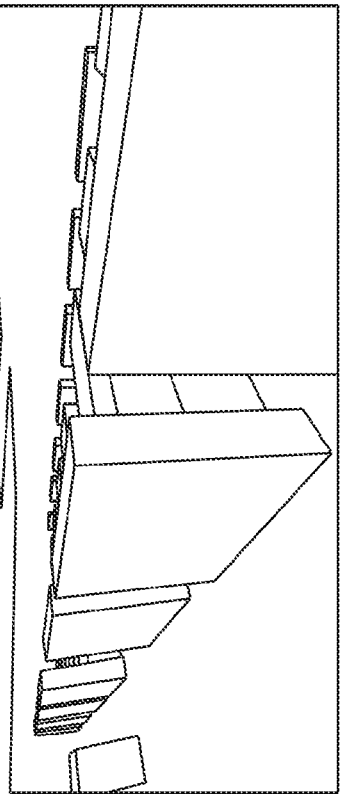
FIG. 2B is a view illustrating a second screen displayed subsequently to the first screen.

FIG. 2A is a view illustrating a first screen when an installation location of a wireless device is determined using a three-dimensional image, FIG. 2B is a view illustrating a second screen displayed subsequently to the first screen, and FIG. 2C is a view illustrating a third screen displayed subsequently to the second screen.

In a method using a three-dimensional image, first, an operator (not illustrated) performs an operation such as movement, rotation, and enlargement of an area included in a display screen in order to display the vicinity of an installation location of a wireless device in an enlarged manner from a three-dimensional image 950 displayed on a display. That is, the operator adjusts the position and angle of a viewpoint, and simultaneously, executes an enlargement processing (so-called zooming) of a display area. The operator executes operations such as movement, rotation, and enlargement of an area included in the display screen numerous times in order to visually recognize a partial area of the three-dimensional image 950, such as a first enlarged image 960 and a second enlarged image 970. In the method using the three-dimensional image, the operator executes complicated operations such as movement, rotation, and enlargement of an area of the three-dimensional image included in the display screen numerous times by operating, for example, a mouse.

(Overview of Information Processing Apparatus According to Embodiment)

The information processing apparatus according to the embodiment generates first image data indicating a first image which includes a plurality of objects, based on location information indicating locations of the plurality of objects arranged within a three-dimensional space, and outputs the generated first image data to a display. Subsequently, the information processing apparatus according to the embodiment determines a display plane which includes a location corresponding to one point of the first image and extends in a vertical direction within a three-dimensional space, according to an operation of an operator.

Subsequently, the information processing apparatus according to the embodiment generates second image data indicating a second image which includes a display plane image and installation candidate marks. The installation candidate marks are arranged to be superimposed on the display plane image and indicate surfaces of a plurality of objects selectable as an installation location of a wireless device. The information processing apparatus according to the embodiment outputs the second image data to the display. Then, the information processing apparatus according to the embodiment determines whether a surface corresponding to any one of installation candidate marks has been selected by the operator, according to the operation of the operator.

The information processing apparatus according to the embodiment determines an installation location where a wireless device is to be installed, through a selecting operation of the operator on the first image, and a selecting operation of the operator on the second image. The information processing apparatus according to the embodiment may determine the installation location where the wireless device is to be installed through two selecting operations. Thus, it becomes easy for the operator to perform a determination operation of the installation location of the wireless device.

(Configuration and Function of Information Processing Apparatus of Executing Installation Location Determination Process, According to First Embodiment)

Figure 3B:
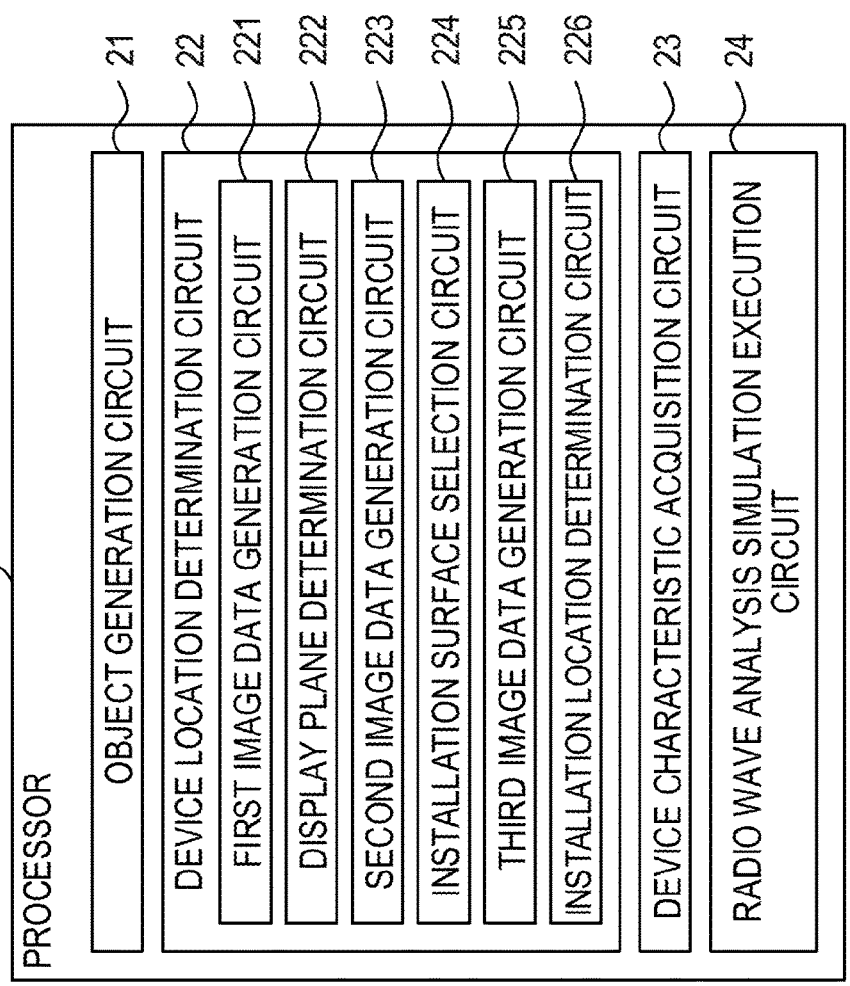
FIG. 3B is a functional block diagram of a processor illustrated in FIG. 3A.
Figure 3A:
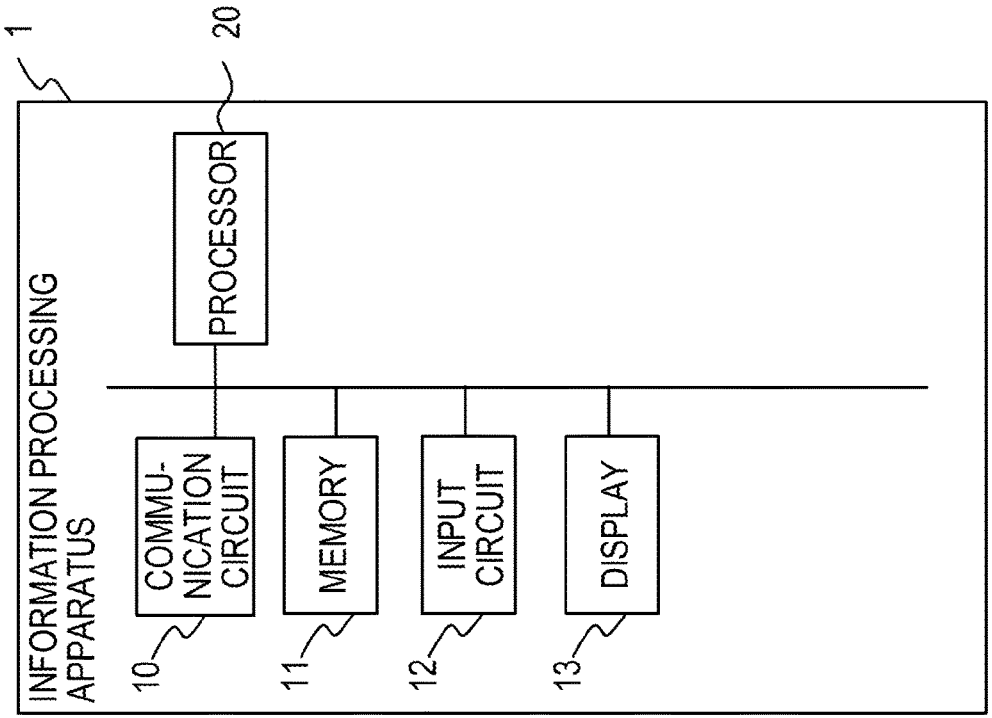
FIG. 3A is a circuit block diagram of an information processing apparatus of executing an installation location determination process, according to a first embodiment.

FIG. 3A is a circuit block diagram of an information processing apparatus of executing an installation location determination process, according to a first embodiment, and FIG. 3B is a functional block diagram of a processor illustrated in FIG. 3A.

An information processing apparatus 1 includes a communication circuit 10, a memory 11, an input circuit 12, a display 13, and a processor 20.

The communication circuit 10 communicates with, for example, a server (not illustrated) via the Internet according to a protocol of Hypertext Transfer Protocol (HTTP). Then, the communication circuit 10 provides data received from, for example, the server to the processor 20. Further, the communication circuit 10 transmits data provided from the processor 20 to, for example, the server.

The memory 11 includes at least one of, for example, a magnetic tape device, a magnetic disk device, and an optical disk device. The memory 11 stores, for example, an operating system program, a driver program, an application program, and data which are used for processing in the processor 20. For example, the memory 11 stores, as the application program, an installation location determination program used for determining a location where a wireless device is to be installed in a radio wave analysis simulation. Further, the memory 11 stores, as the application program, a radio wave analysis program used for executing a radio wave analysis simulation for a radio wave analysis of the wireless device whose installation location has been determined by the installation location determination program. The installation location determination program and the radio wave analysis program may be installed in the memory 11 using, for example, a congenitally known setup program from, for example, a computer-readable portable recording medium such as a CD-ROM or a DVD-ROM.

Further, the memory 11 stores various data used for an installation location determination process and a radio wave analysis process. Furthermore, the memory 11 may temporarily store temporary data on a predetermined process.

FIGS. 4A to 4F are views illustrating examples of tables stored in a memory, FIG. 4A illustrates a layout table, FIG. 4B illustrates a device table, FIG. 4C illustrates a material table, and FIG. 4D illustrates an antenna table. FIG. 4E illustrates an application table, and FIG. 4F illustrates an installation-related table.

A layout table 401 indicates shape information indicating shapes of a plurality of objects arranged within a three-dimensional space and location information indicating locations of the plurality of objects within the three-dimensional space. The layout table 401 includes an object ID which identifies each of the plurality of objects, and coordinate information and a material ID which are stored in association with the object ID. The layout table 401 stores four sets of coordinates as the coordinate information, and indicates that the shapes of the plurality of objects are rectangular while indicating the locations of the plurality of objects within the three-dimensional space. The layout table 401 stores coordinate information indicating that the shapes of the plurality of objects are rectangular, but the information processing apparatus according to the embodiment may store coordinate information indicating that the shapes of the plurality of objects are shapes other than rectangles, such as triangles. The material ID is an identifier to be associated with a material table 403 that stores material data indicating materials of an upper surface and a lower surface of each of the plurality of rectangular objects.

The device table 402 stores information on wireless device used for a radio wave analysis simulation. The device table 402 includes a device ID that identifies each of the wireless device, and an antenna ID, a transmission frequency, a transmission power, a tilt angle, and an oriented direction which are stored in association with the device ID. The antenna ID is an identifier to be associated with an antenna table 404 in order to define an antenna used for each of the wireless device. Each of the transmission frequency, the transmission power, the tilt angle, and the oriented direction defines characteristics of the antenna used for each of the wireless device.

The material table 403 stores information on materials of the plurality of objects arranged within the three-dimensional space. The information stored in the material table 403 is used when the processor 20 executes the radio wave analysis simulation. The material table 403 includes a material ID that identifies each of materials, and thickness information and electric characteristic information which are stored in association with the material ID. The thickness information indicates a thickness of a material identified by the material ID, and the electric characteristic information indicates characteristic data of the material identified by the material ID, such as a relative permittivity and a conductivity.

The antenna table 404 stores information indicating characteristics of an antenna used for each of the wireless device. The antenna table 404 includes an antenna ID that identifies each of antennas, and directivity information stored in association with the antenna ID. The directivity information indicates characteristic data of an antenna identified by the antenna ID, such as directivity data in the θ direction and φ direction.

The application table 405 stores information indicating an installation surface on which a recommended wireless device is to be installed which is recommended in a mode in which each of the wireless devices is used. The application table 405 includes an application ID that identifies each of modes in which each of the wireless devices is used, and recommended installation surface information stored in association with the application ID. The recommended installation surface information indicates an installation surface on which the recommended wireless device is to be installed which is recommended in a mode identified by the application ID.

The installation-related table 406 stores information to be referred to when the wireless device is installed. The installation-related table includes an application ID that identifies each of modes in which each of the wireless devices is used, and automatic installation surface information and separation distance information stored in association with the application ID. The automatic installation surface information is information used when the wireless device is automatically arranged in a specific mode such as a mode in which indoor arrangement distribution of people is detected by, for example, a beacon. The automatic installation surface information is defined as a number, for example, when the surface of a ceiling or an outer wall designated through a clicking by the operator is set to "1." The separation distance information defines a separation distance between the installation surface where the wireless device is to be installed, and the wireless device.

The input circuit 12 may be any device as long as data may be input through the input circuit 12. The input circuit 12 is, for example, a touch panel or a key button. The operator may input, for example, texts, numbers, and symbols using the input circuit 12. When the input circuit 12 is operated by the operator, the input circuit 12 generates a signal corresponding to the operation. Then, the generated signal is provided to the processor 20, as an instruction of the operator.

The display 13 may be any device as long as the display 13 is capable of displaying, for example, images and frames, and is, for example, a liquid crystal display or an organic Electro-Luminescence (EL) display. The display 13 displays, for example, images according to image data provided from the processor 20 or frames according to moving image data.

The processor 20 includes one or a plurality of processors and peripheral circuits thereof. The processor 20 collectively controls the overall operation of the information processing apparatus 1, and is, for example, a CPU. The processor 20 executes processings based on programs (e.g., a driver program, an operating system program, and an application program) stored in the memory 11. The processor 20 may execute a plurality of programs (e.g., the application program) in parallel.

The processor 20 includes an object generation circuit 21, a device location determination circuit 22, a device characteristic acquisition circuit 23, and a radio wave analysis simulation execution circuit 24. The device location determination circuit 22 includes a first image data generation circuit 221, a display plane determination circuit 222, a second image data generation circuit 223, an installation surface selection circuit 224, a third image data generation circuit 225, and an installation location determination circuit 226. Each of these circuits is a functional module implemented by programs executed in the processors provided in the processor 20. Alternatively, each of the circuits may be implemented as firmware in the information processing apparatus 1.

(Radio Wave Analysis Process by Information Processing Apparatus according to First Embodiment)

Figure 5:
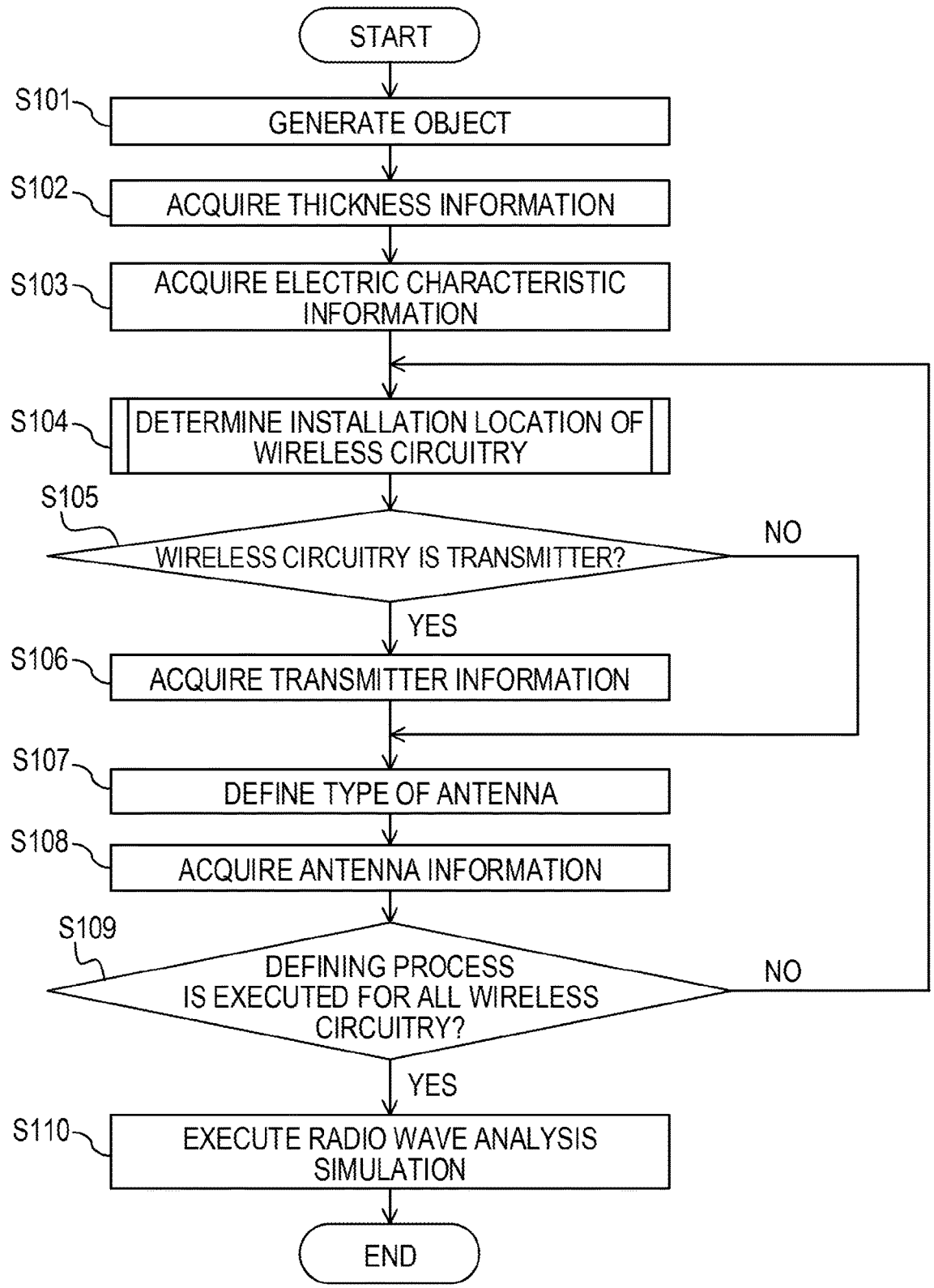
FIG. 5 is a flow chart of a radio wave analysis process by the information processing apparatus illustrated in FIGS. 3A and 3B.

FIG. 5 is a flow chart of a radio wave analysis process by the information processing apparatus 1. The radio wave analysis process illustrated in FIG. 5 is executed mainly by the processor 20 in cooperation with the respective components of the information processing apparatus 1, based on programs stored in advance in the memory 11.

First, the object generation circuit 21 generates each of a plurality of objects to be arranged in a three-dimensional space in which a radio wave analysis simulation is to be executed (S101). The object generation circuit 21 may generate, for example, three-dimensional dot data from image data indicating an image obtained by capturing a three-dimensional space in which the radio wave analysis simulation is to be executed, and generate each of the plurality of objects from the generated three-dimensional dot data. The object generation circuit 21 attaches an object ID to the generated object, and simultaneously, stores coordinate information defining the shape and location of the generated object, in the layout table 401 in association with the object ID.

Subsequently, the object generation circuit 21 acquires thickness information indicating the thickness of each of the plurality of objects generated through the processing in S101, according to an operation of the input circuit 12 by an operator (not illustrated) (S102). The object generation circuit 21 stores the acquired thickness information in the material table 403, in association with a material ID associated with each of the plurality of objects. Subsequently, the object generation circuit 21 acquires electric characteristic information indicating the electric characteristic of each of the plurality of objects generated through the processing in S101, according to an operation of the input circuit 12 by the operator (S103). The object generation circuit 21 stores the acquired electric characteristic information in the material table 403, in association with the material ID associated with each of the plurality of objects.

Subsequently, the device location determination circuit 22 determines an installation location where a wireless device is to be installed according to an operation of the input circuit 12 by the operator (S104). The device location determination circuit 22 stores the installation location determined through the processing in S104, in the device table 402 in association with a device ID.

Subsequently, the device characteristic acquisition circuit 23 determines whether the wireless device whose installation location has been determined through the processing in S104 is a transmitter or a receiver, according to an operation of the input circuit 12 by the operator (S105).

When it is determined that the wireless device whose installation location has been determined through the processing in S104 is a transmitter (S105-YES), the device characteristic acquisition circuit 23 acquires transmitter information indicating a transmission frequency and a transmission power, according to an operation of the input circuit 12 by the operator (S106). The device characteristic acquisition circuit 23 stores the information acquired through the processing in S106 in the device table 402 in association with the device ID stored through the processing in S104.

Subsequently, the device characteristic acquisition circuit 23 defines the type of an antenna of the wireless device whose installation location has been determined through the processing in S104, according to an operation of the input circuit 12 by the operator (S107). The device characteristic acquisition circuit 23 displays, for example, an image corresponding to the antenna table 404 on the display 13 such that the image is selectable, and thus, urges the operator to perform an operation. The device characteristic acquisition circuit 23 stores an antenna ID corresponding to the type of the antenna defined through the processing in S107, in the device table 402 in association with the device ID stored through the processing in S104.

Subsequently, the device characteristic acquisition circuit 23 acquires antenna information indicating the inclination and direction of the antenna of the wireless device whose installation location has been determined through the processing in S104, according to an operation of the input circuit 12 by the operator (S108). The device characteristic acquisition circuit 23 stores the information acquired through the processing in S108, in the device table 402 in association with the device ID stored through the processing in S104.

Subsequently, the device characteristic acquisition circuit 23 determines whether the processings in S104 to S108 have been executed for all the wireless device to be used for the radio wave analysis simulation, according to an operation of the input circuit 12 by the operator (S109). Until the device characteristic acquisition circuit 23 determines that the processings in S104 to S108 have been executed for all the wireless device (S109-YES), the processings in S104 to S109 are repeated.

When the device characteristic acquisition circuit 23 determines that the processings in S104 to S108 have been executed for all the wireless device (S109-YES), the radio wave analysis simulation execution circuit 24 executes the radio wave analysis simulation (S110).

(Installation Location Determination Process by Information Processing Apparatus According to First Embodiment)

Figure 6:
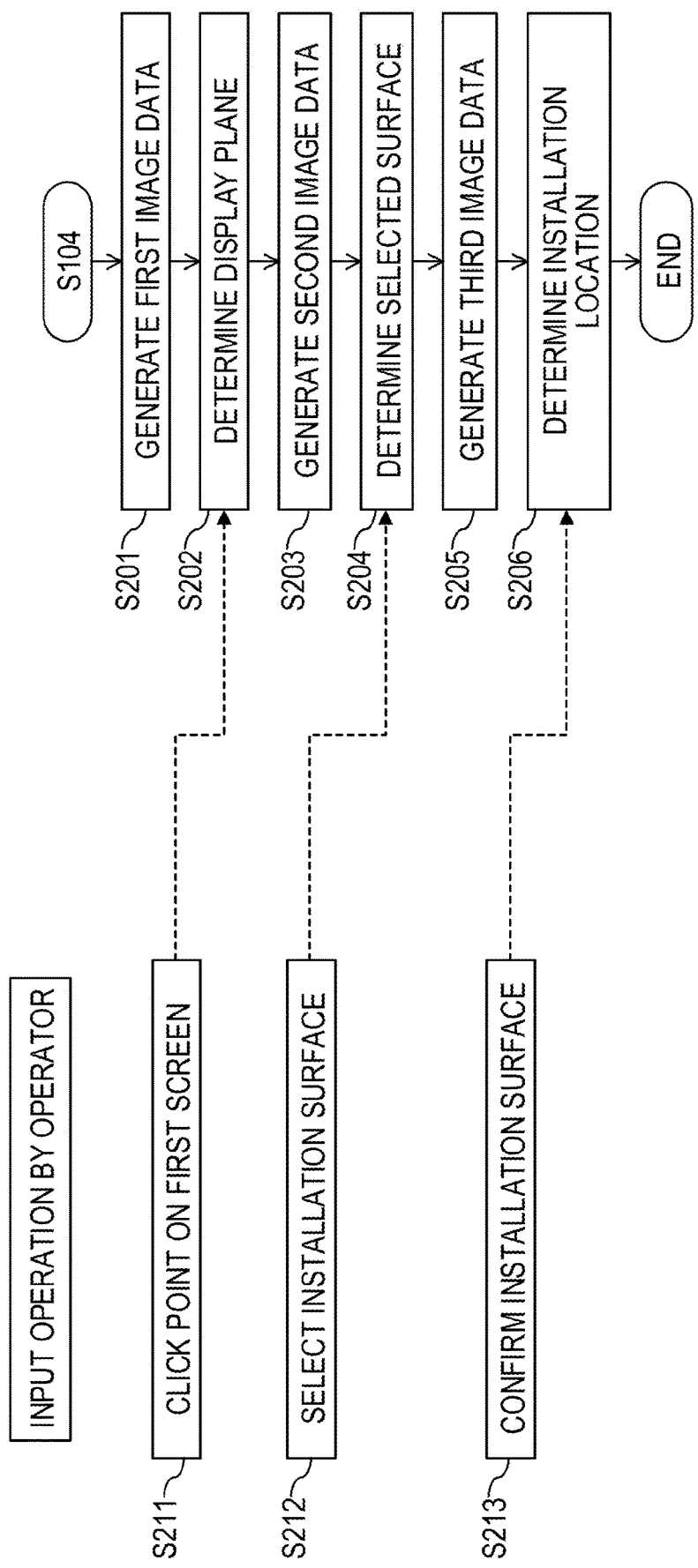
FIG. 6 is a more detailed flow chart of the processing described in S104 illustrated in FIG. 5.

FIG. 6 is a more detailed flow chart of the processing described in S104.

First, the first image data generation circuit 221 generates first image data that indicates a first image including the plurality of objects generated through the processing in S101 based on location information of the plurality of objects (S201). The first image data generation circuit 221 outputs the generated first image data to the display 13, and the display 13 displays a first image corresponding to the input first image data. The first image may be a two-dimensional image as illustrated in FIG. 1A, or a three-dimensional image as illustrated in FIG. 2A.

Subsequently, the display plane determination circuit 222 determines a display plane which includes a location corresponding to one point of the first image generated through the processing in S201 and extends in a vertical direction within a three-dimensional space, according to a click operation (S211) by the operator on a screen on which the first image is displayed (S202). The click operation by the operator on the screen on which the first image is displayed is a first selecting operation by the operator.

Figure 7A:
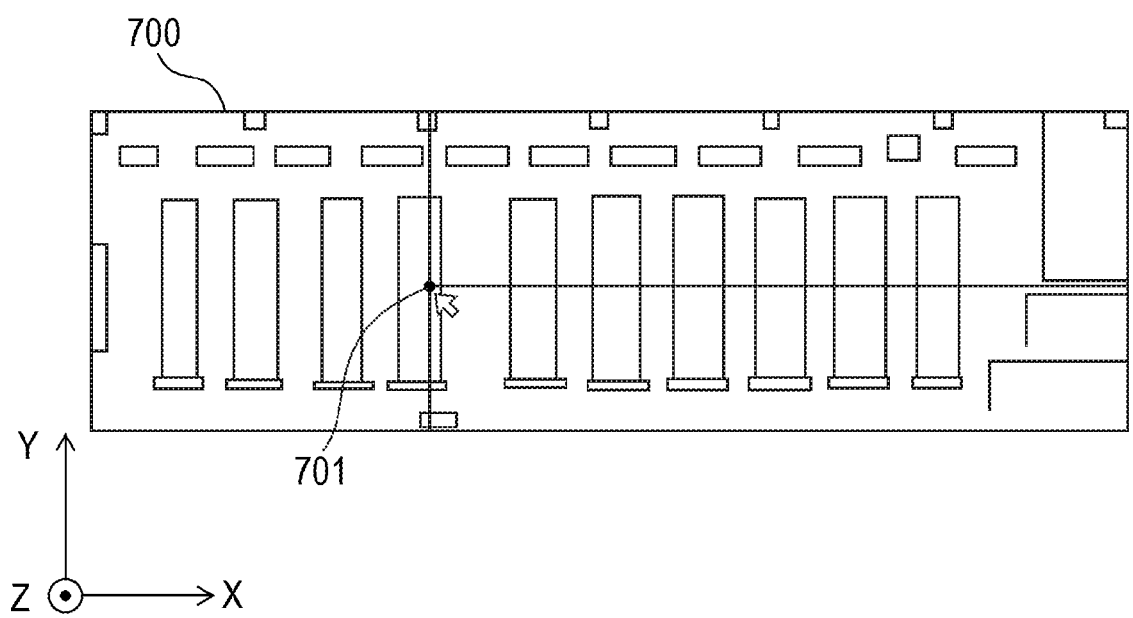
FIG. 7A is a first view for explaining the processing in S202 illustrated in FIG. 6.
Figure 7B:
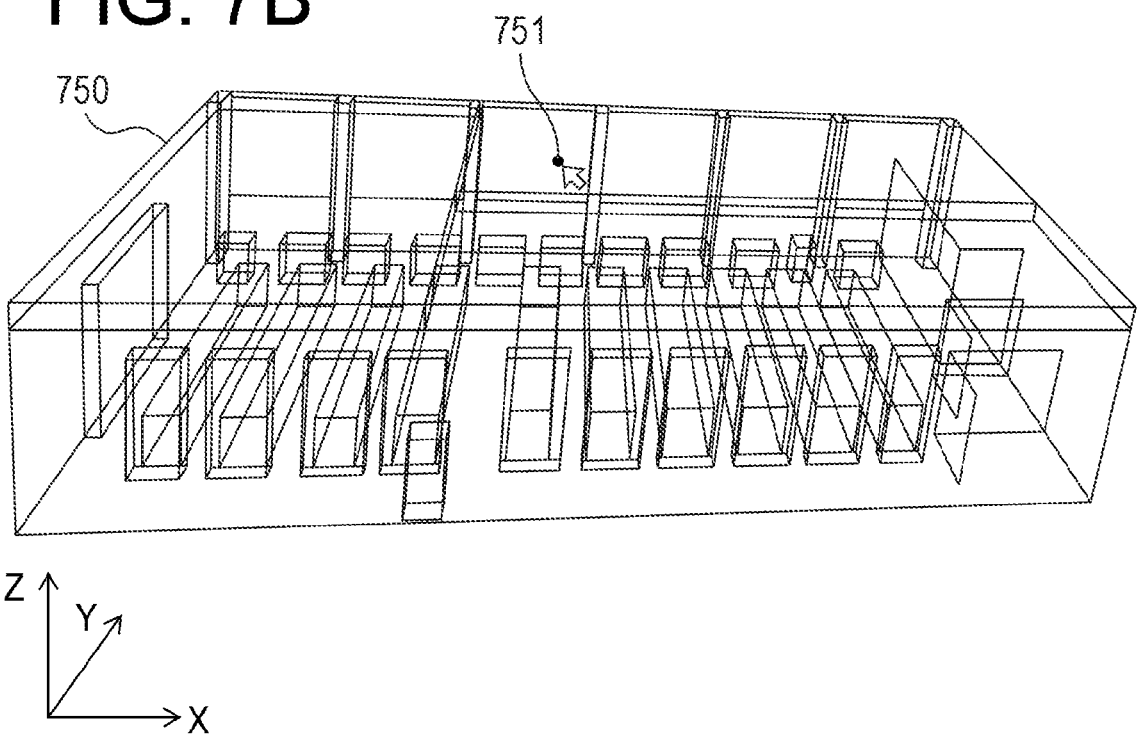
FIG. 7B is a second view for explaining the processing in S202 illustrated in FIG. 6.

FIG. 7A is a first view for explaining the processing in S202 by the display plane determination circuit 222, and FIG. 7B is a second view for explaining the processing in S202 by the display plane determination circuit 222.

The first selecting operation by the operator may be a click operation using a mouse on a desired point 701 in a two-dimensional image illustrating a plan view 700 of the three-dimensional space, as illustrated in FIG. 7A. The first selecting operation by the operator may be a click operation using a mouse on a desired point 751 on a ceiling, a side wall or the like in a three-dimensional image 750 illustrating the three-dimensional space, as illustrated in FIG. 7B. When the first selecting operation by the operator is a click operation on the side wall in the three-dimensional image 750, the display plane becomes a plane including a location corresponding to the clicked one point and perpendicular to the clicked side wall.

Subsequently, the second image data generation circuit 223 generates second image data, and outputs the generated second image data to the display 13 (S203). The second image data illustrates a second image which includes a display plane image and installation candidate marks. The display plane image includes the plurality of objects included in the display plane determined through the processing in S202, and the installation candidate marks are arranged to be superimposed on the display plane image and indicate surfaces of the plurality of objects selectable as an installation location of a wireless device. As an example, the display plane image is a plane including a point 701 illustrated in FIG. 7A and extending in the X direction and the Z direction. As another example, the display plane image is a plane including the point 701 illustrated in FIG. 7A and extending in the Y direction and the Z direction.

The second image data generation circuit 223 may switch the display plane image included in the second image according to an instruction of the operator (not illustrated). For example, the second image data generation circuit 223 may generate a plane extending in the X direction as the display plane image when the operator presses an "X" key of a keyboard, and may generate a plane extending in the Y direction as the display plane image when the operator presses a "Y" key. For example, the second image data generation circuit 223 may generate a plane extending in the X direction as the display plane image when an "X" button displayed on the display 13 is clicked, and may generate a plane extending in the Y direction as the display plane image when a "Y" button is clicked.

Subsequently, the installation surface selection circuit 224 determines whether a surface corresponding to any one of the installation candidate marks has been selected by the operator, through a second selecting operation of the operator, according to a selecting operation (S212) of an installation surface by the operator on a screen displaying the second image (S204). The selecting operation of the installation surface by the operator on the screen displaying the second image is a second selecting operation by the operator.

Subsequently, the third image data generation circuit 225 generates third image data indicating a third image that displays the selected installation candidate mark in a display format different from that of other installation candidate marks, according to the second selecting operation by the operator (S205). The third image data generation circuit 225 outputs the generated third image data to the display 13.

Figure 8A:
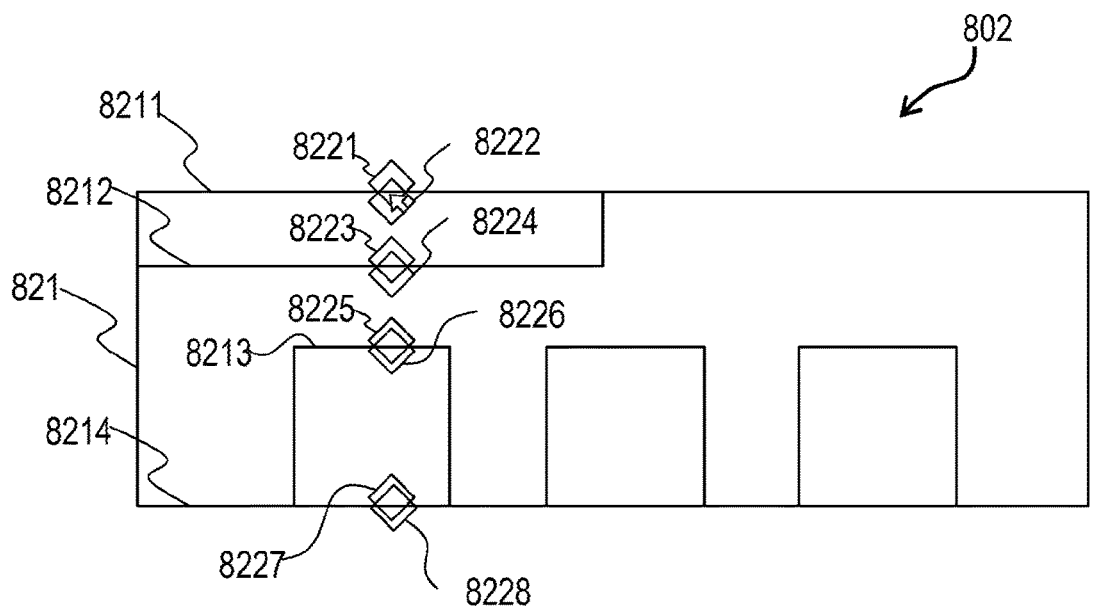
FIG. 8A is a view illustrating an example of a second image corresponding to second image data generated by a second image data generation circuit illustrated in FIG. 3B.
Figure 8B:
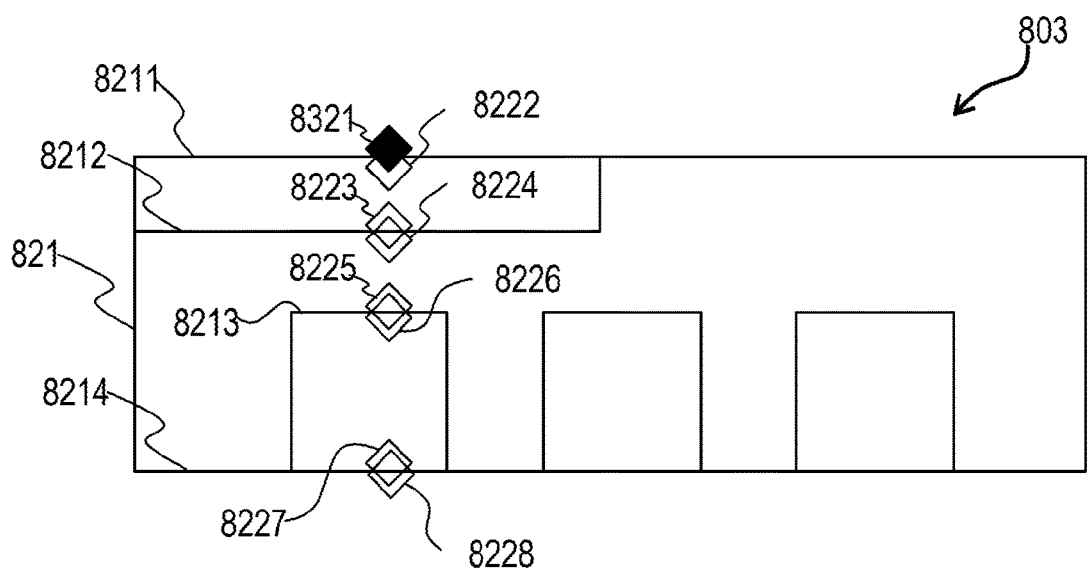
FIG. 8B is a view illustrating an example of a third image corresponding to third image data generated by a third image data generation circuit illustrated in FIG. 3B.

FIG. 8A is a view illustrating an example of the second image corresponding to the second image data generated by the second image data generation circuit 223, and FIG. 8B is a view illustrating an example of the third image corresponding to the third image data generated by the third image data generation circuit 225.

A second image 802 includes a display plane image 821 formed of a plurality of objects each of which is indicated by a straight line, and installation candidate marks 8221 to 8228 arranged to be superimposed on the display plane image 821 in FIG. 8A. The display plane image 821 includes a first object 8211 indicating a ceiling, a second object 8212 indicating a lower surface of a member attached to the ceiling, a third object 8213 indicating an upper surface of a member arranged on a floor surface, and a fourth object 8214 indicating the floor surface. In FIG. 8A, the plurality of objects are indicated by straight lines, but in the information processing apparatus according to the embodiment, the plurality of objects may be displayed in shapes such as curves, other than the straight lines.

The installation candidate mark 8221 corresponds to the front surface of the first object 8211, and the installation candidate mark 8222 corresponds to the back surface of the first object 8211. The installation candidate mark 8223 corresponds to the front surface of the second object 8212, and the installation candidate mark 8224 corresponds to the back surface of the second object 8212. The installation candidate mark 8225 corresponds to the front surface of the third object 8213, and the installation candidate mark 8226 corresponds to the back surface of the third object 8213. The installation candidate mark 8227 corresponds to the front surface of the fourth object 8214, and the installation candidate mark 8228 corresponds to the back surface of the fourth object 8214.

A third image 803 is different from the second image 802 in that an installation candidate mark 8321 corresponding to the front surface of the first object 8211 is arranged instead of the installation candidate mark 8221. The installation candidate mark 8321 is displayed in a display format different from that of other installation candidate marks 8222 to 8228, so as to indicate that the installation candidate mark 8221 has been selected through the second selection process of the operator, such as clicking with a mouse, and has been activated. For example, the installation candidate mark 8321 may be displayed blinkingly, displayed in a shape other than that of other installation candidate marks 8222 to 8228, or displayed in a color other than that of other installation candidate marks 8222 to 8228. Other installation candidate marks 8222 to 8228 may be indicated by broken lines so as to indicate the inactivation.

Then, the installation location determination circuit 226 determines the installation location of a wireless device based on the location corresponding to one point of the first image, and the location of the surface selected by the installation surface selection circuit 224, according to a confirmation operation (S213) of the installation surface by the operator (S206). The operator may execute the confirmation operation by pressing a screen displayed on the display 13 when, for example, a confirmation signal indicating whether the selected surface may be set as a surface where the wireless device is to be arranged is input from the installation location determination circuit 226. The installation location determination circuit 226 determines coordinates indicating the location where the wireless device is to be installed, from an X coordinate and a Y coordinate corresponding to the point of the first image selected by the operator in the processing in S202, and a Z coordinate corresponding to the surface of the second image selected in the processing in S204. The installation location determination circuit 226 stores the determined coordinates in the device table 402.

(Operational Effect of Information Processing Apparatus According to First Embodiment)

The information processing apparatus according to the first embodiment determines the X coordinate and the Y coordinate of an installation location where the wireless device is to be installed, through a selecting operation by the operator on the first image, and determines the Z coordinate of the installation location where the wireless device is to be installed, through a selecting operation by the operator on the second image. The information processing apparatus according to the first embodiment may determine the installation location where the wireless device is to be installed through two selecting operations. Thus, it becomes easy for the operator to perform a determination operation of the installation location of the wireless device.

The information processing apparatus according to the first embodiment displays the third image which displays the selected installation candidate mark in a display format different from that of other installation candidate marks so that the confirmation operation of the installation location of the wireless device by the operator may be facilitated.

(Configuration and Function of Information Processing Apparatus of Executing Installation Location Determination Process, According to Second Embodiment)

Figure 9B:
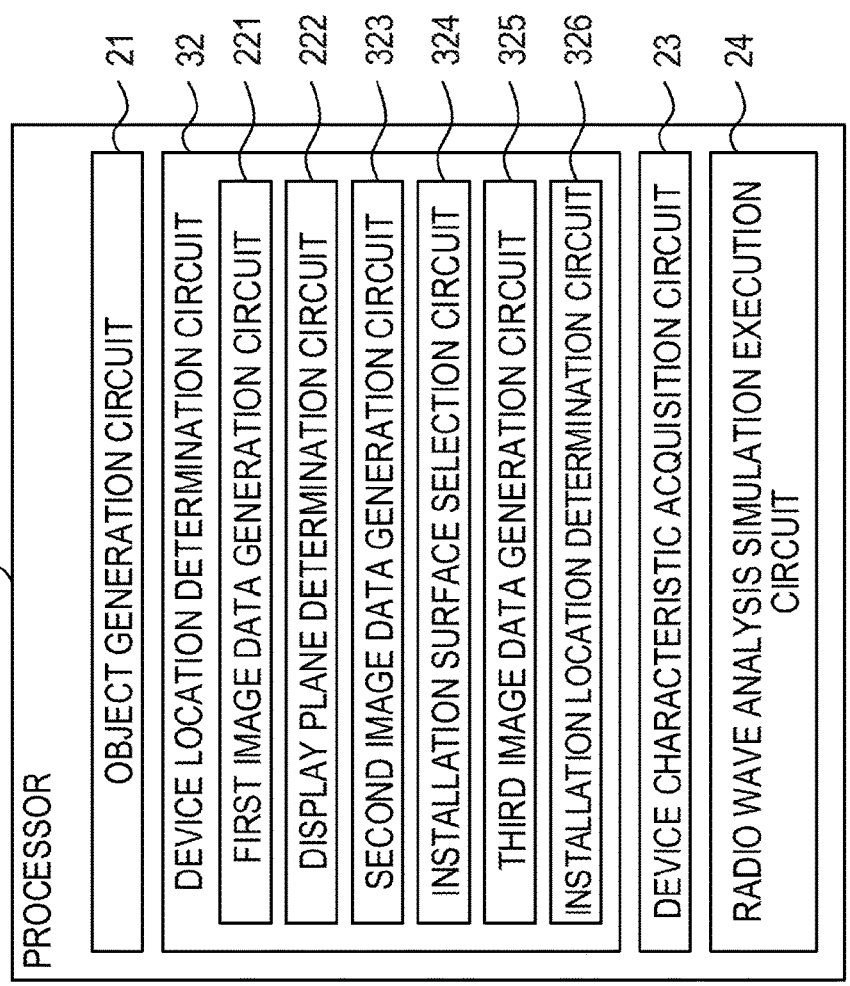
FIG. 9B is a functional block diagram of a processor illustrated in FIG. 9A.
Figure 9A:
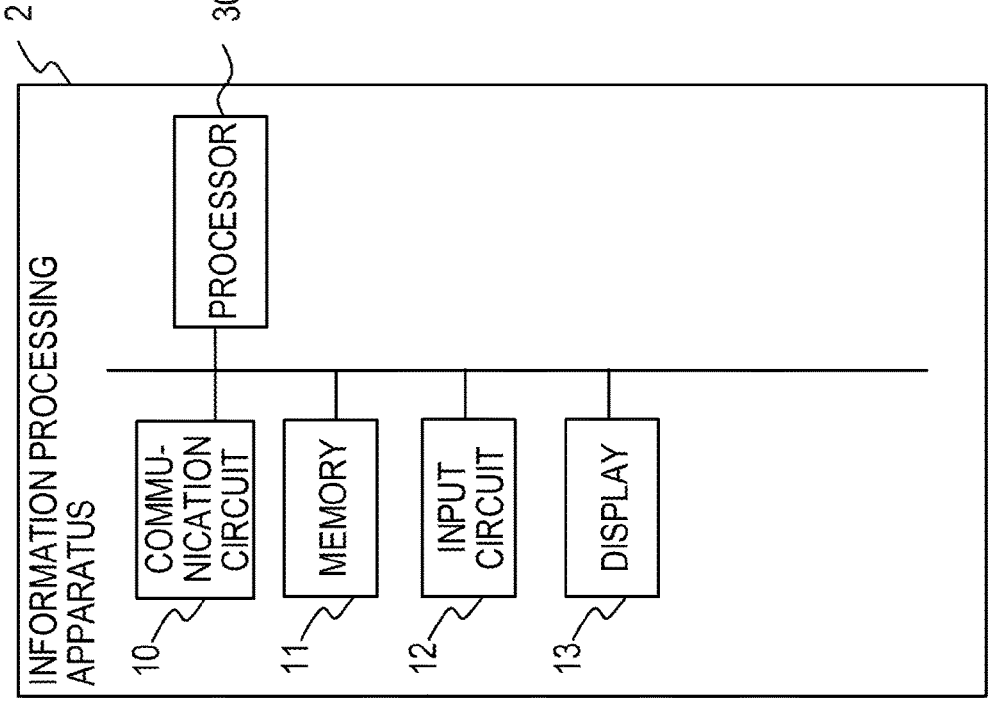
FIG. 9A is a circuit block diagram of an information processing apparatus of executing an installation location determination process, according to a second embodiment.

FIG. 9A is a circuit block diagram of an information processing apparatus of executing an installation location determination process, according to a second embodiment, and FIG. 9B is a functional block diagram of a processor illustrated in FIG. 9A.

An information processing apparatus 2 is different from the information processing apparatus 1 in that the information processing apparatus 2 includes a processor 30 instead of the processor 20. The processor 30 is different from the processor 20 in that the processor 30 includes a device location determination circuit 32 instead of the device location determination circuit 22. The device location determination circuit 32 is different from the device location determination circuit 22 in that the device location determination circuit 32 includes a second image data generation circuit 323, an installation surface selection circuit 324, a third image data generation circuit 325, and an installation location determination circuit 326, instead of the second image data generation circuit 223 to the installation location determination circuit 226. The configuration and function of the constituent elements of the information processing apparatus 2, except for the second image data generation circuit 323 to the installation location determination circuit 326, are the same as those of the constituent elements of the information processing apparatus 1 denoted by the same reference numerals, and thus detailed descriptions thereof will be omitted herein.

FIG. 10A is a view illustrating an example of a second image corresponding to second image data generated by the second image data generation circuit 323, and FIG. 10B is a view illustrating an example of a third image corresponding to third image data generated by the third image data generation circuit 325.

A second image 1002 is different from the second image 802 in that the second image 1002 includes a selection list 1020. The constituent elements of the second image 1002, except for the selection list 1020, are the same as those of the second image 802 denoted by the same reference numerals, and thus detailed descriptions thereof will be omitted herein.

The second image data generation circuit 323 generates second image data indicating a second image that includes the selection list 1020, in addition to the display plane image 821 and the eight installation candidate marks 8221 to 8228, and outputs the generated second image data to the display 13 (S203). Subsequently, the installation surface selection circuit 324 determines whether a surface corresponding to any one of the installation candidate marks has been selected by the operator through a second selecting operation of the operator (S204). The operator may click a character string included in the selection list 1020 to execute the second selecting operation.

Subsequently, the third image data generation circuit 325 generates third image data indicating a third image that displays the selected installation candidate mark in a display format different from that of other installation candidate marks, according to the second selecting operation by the operator (S205).

The third image 1003 is different from the third image 803 in that the third image 1003 includes a selection list 1030. The constituent elements of the third image 1003, except for the selection list 1030, are the same as those of the third image 803 denoted by the same reference numerals, and thus detailed descriptions thereof will be omitted herein. The selection list 1030 is different from the selection list 1020 in that the display format of the selected character string is different from that of other character strings.

Then, the installation location determination circuit 326 determines the installation location of a wireless device based on the location corresponding to one point of the first image, and the location of the surface selected by the installation surface selection circuit 324, according to a confirmation operation by the operator (S206).

(Operational Effect of Information Processing Apparatus According to Second Embodiment)

The information processing apparatus according to the second embodiment enables the execution of the selecting operation of the operator on the second image including the selection list, and thus, the operator may execute the determination operation of the installation location of a wireless device while confirming the installation location of the wireless device on the second image and the third image.

(Configuration and Function of Information Processing Apparatus of Executing Installation Location Determination Process, According to Third Embodiment)

Figure 11A:
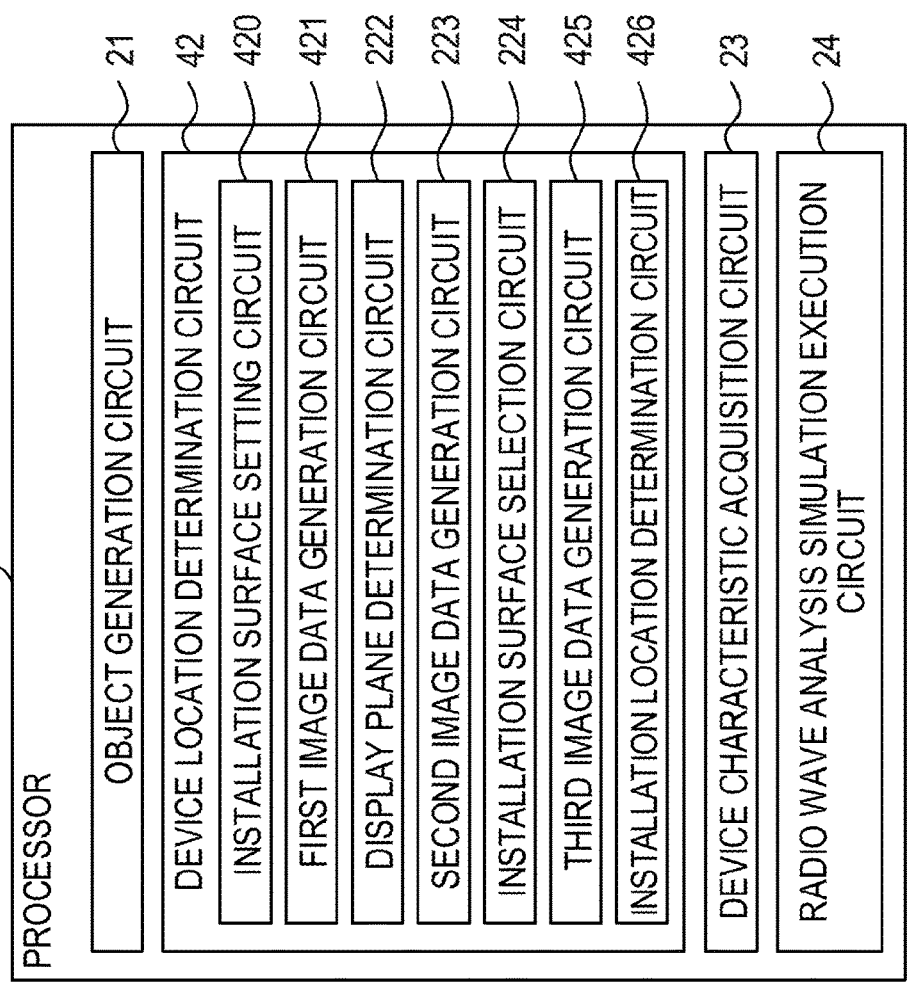
FIG. 11A is a circuit block diagram of an information processing apparatus of executing an installation location determination process, according to a third embodiment.
Figure 11B:
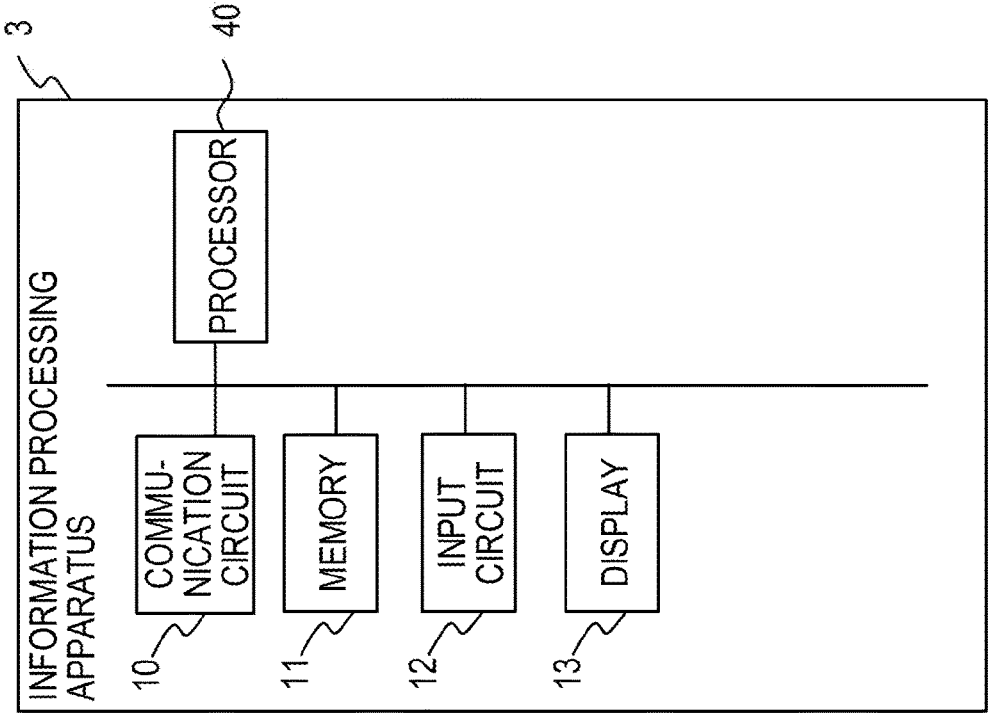
FIG. 11B is a functional block diagram of a processor illustrated in FIG. 11A.

FIG. 11A is a circuit block diagram of an information processing apparatus of executing an installation location determination process, according to a third embodiment, and FIG. 11B is a functional block diagram of a processor illustrated in FIG. 11A.

An information processing apparatus 3 is different from the information processing apparatus 1 in that the information processing apparatus 3 includes a processor 40 instead of the processor 20. The processor 40 is different from the processor 20 in that the processor 40 includes a device location determination circuit 42 instead of the device location determination circuit 22. The device location determination circuit 42 is different from the device location determination circuit 22 in that the device location determination circuit 42 includes a first image data generation circuit 421, a third image data generation circuit 425, and an installation location determination circuit 426, instead of the first image data generation circuit 221, the third image data generation circuit 225, and the installation location determination circuit 226. The device location determination circuit 42 is different from the device location determination circuit 22 in that the device location determination circuit 42 includes an installation surface setting circuit 420. The configuration and function of the constituent elements of the information processing apparatus 3, except for the installation surface setting circuit 420, the first image data generation circuit 421, the third image data generation circuit 425, and the installation location determination circuit 426, are the same as those of the constituent elements of the information processing apparatus 1 denoted by the same reference numerals, and thus detailed descriptions thereof will be omitted herein.

(Radio Wave Analysis Process by Information Processing Apparatus According to Third Embodiment)

Figure 12:
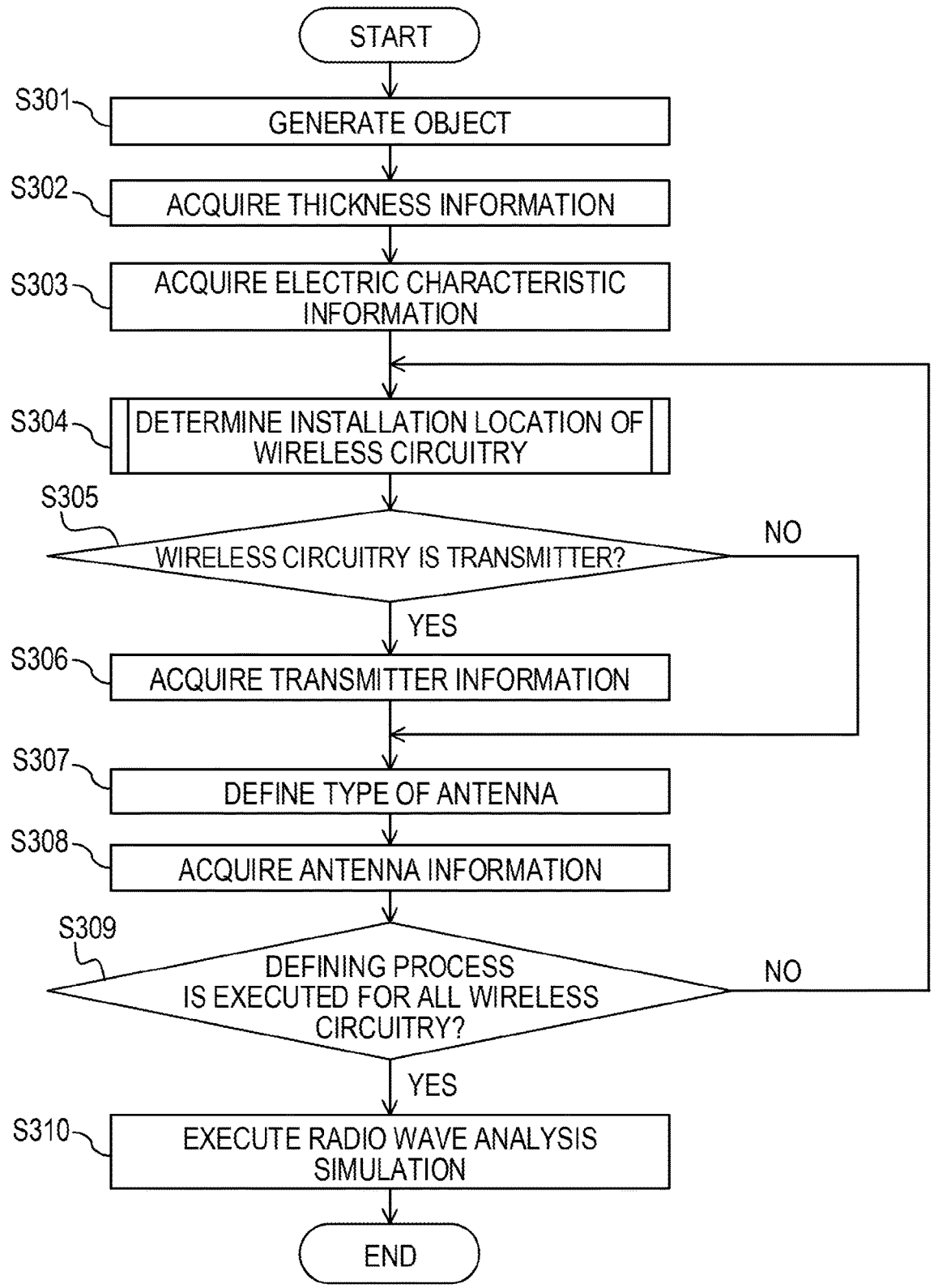
FIG. 12 is a flow chart of a radio wave analysis process by the information processing apparatus illustrated in FIGS. 11A and 11B.

FIG. 12 is a flow chart of a radio wave analysis process by the information processing apparatus 3. The radio wave analysis process illustrated in FIG. 12 is executed mainly by the processor 40 in cooperation with the respective components of the information processing apparatus 3, based on programs stored in advance in the memory 11.

The processings in S301 to S303 and S305 to S310 are the same as the processings of S101 to S103 and S105 to S110, and thus, detailed descriptions thereof will be omitted herein. The device location determination circuit 42 determines an installation location where a wireless device is to be installed according to an operation of the input circuit 12 by the operator (S304). The device location determination circuit 42 stores the installation location determined through the processing in S304, in the device table 402 in association with a device ID.

(Installation Location Determination Process by Information Processing Apparatus According to Third Embodiment)

Figure 13:
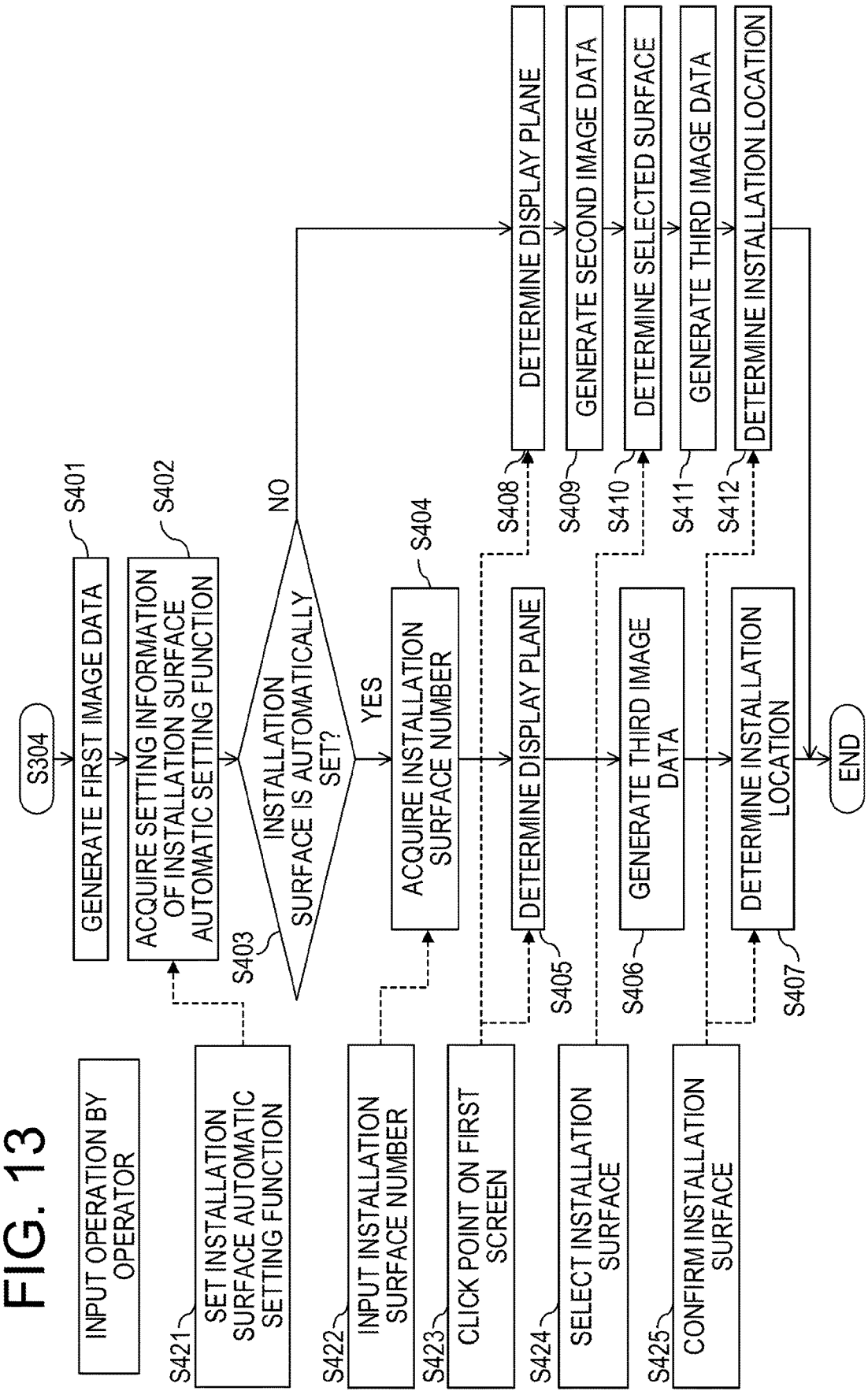
FIG. 13 is a more detailed flow chart of the processing described in S304 illustrated in FIG. 12.

FIG. 13 is a more detailed flow chart of the processing described in S304.

First, the first image data generation circuit 421 generates first image data that indicates a first image including the plurality of objects generated through the processing in S301 based on location information of the plurality of objects, an installation surface automatic setting button, and an installation surface number input form (S401).

Figure 14:
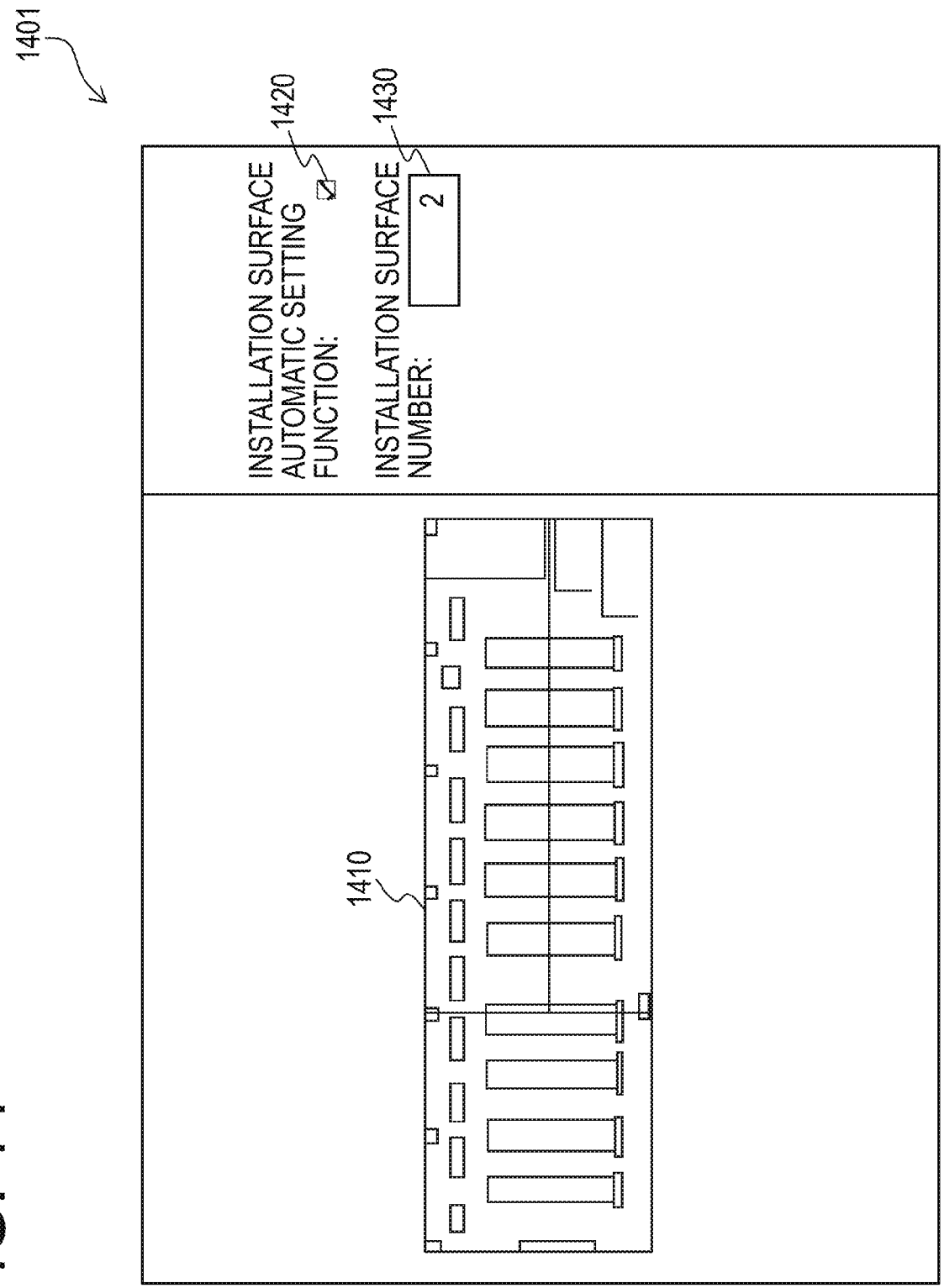
FIG. 14 is a view illustrating an example of a first image corresponding to first image data generated by a first image data generation circuit illustrated in FIG. 11B.

FIG. 14 is a view illustrating an example of the first image corresponding to the first image data generated by the first image data generation circuit 421.

A first image 1401 includes a plurality of objects 1410 based on the location information of the plurality of objects generated through the processing in S301, an installation surface automatic setting button 1420, and an installation surface number input form 1430. The installation surface automatic setting button 1420 sequentially displays an ONstate and an OFF-state according to clicking by the operator. The installation surface number input form 1430 displays an installation surface number such that the installation surface number may be input.

Subsequently, the installation surface setting circuit 420 acquires setting information of an installation surface automatic setting function according to a setting operation S421 on the installation surface automatic setting button 1420 by the operator (S402). Subsequently, the installation surface setting circuit 420 determines whether or not to automatically set the surface of an object on which the wireless device is to be installed, based on the setting information acquired through the processing in S402 (S403). Subsequently, the installation surface setting circuit 420 acquires an installation surface number according to an input operation (S422) by the operator on the installation surface number input form 1430 (S404). The installation surface setting circuit 420 sets the acquired preset surface number in the application table 405. The installation surface may be defined by, for example, the number of surfaces to be clicked by the operator on the first image, such as a ceiling or a side surface.

Subsequently, the display plane determination circuit 222 determines a display plane which includes a location corresponding to one point of the first image generated through the processing in S401 and extends in a vertical direction within a three-dimensional space, according to a click operation (S423) by the operator on a screen on which the first image is displayed (S405). The click operation by the operator on the screen on which the first image is displayed is a first selecting operation by the operator.

Subsequently, the third image data generation circuit 425 generates third image data indicating a third image that displays a selected installation candidate mark in a display format different from that of other installation candidate marks (S406). The third image data indicates a third image which includes a display plane image and installation candidate marks. The display plane image includes the plurality of objects included in the display plane determined through the processing in S405, and the installation candidate marks are arranged to be superimposed on the display plane image. The installation candidate mark corresponding to the surface set to the installation surface through the processing in S404 is displayed in a display format different from other installation candidate marks.

Figure 15:
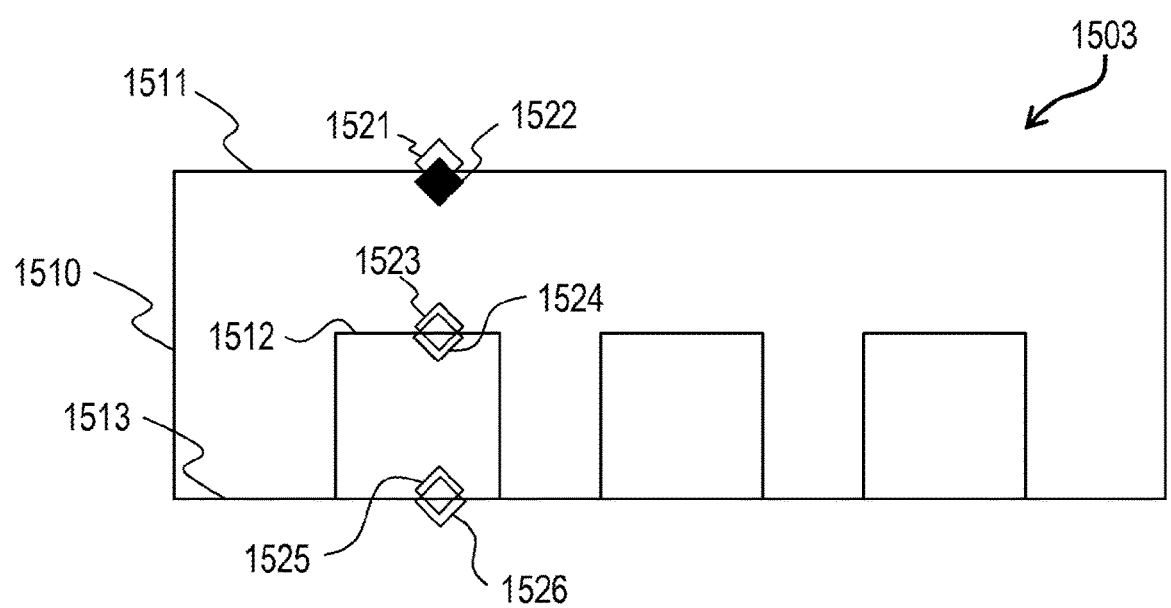
FIG. 15 is a view illustrating an example of a third image corresponding to third image data generated by a third image data generation circuit illustrated in FIG. 11B.

FIG. 15 is a view illustrating an example of a third image corresponding to the third image data generated by the third image data generation circuit 425.

A third image 1503 includes a display plane image 1510 formed of a plurality of objects each of which is indicated by a straight line, and installation candidate marks 1521 to 1526 arranged to be superimposed on the display plane image 1510 in FIG. 15. The display plane image 1510 includes a first object 1511 indicating a ceiling, a second object 1512 indicating an upper surface of a member arranged on a floor surface, and a third object 1513 indicating the floor surface.

The installation candidate mark 1521 corresponds to the front surface of the first object 1511, and the installation candidate mark 1522 corresponds to the back surface of the first object 1511. The installation candidate mark 1523 corresponds to the front surface of the second object 1512, and the installation candidate mark 1524 corresponds to the back surface of the second object 1512. The installation candidate mark 1525 corresponds to the front surface of the third object 1513, and the installation candidate mark 1526 corresponds to the back surface of the third object 1513.

In the example illustrated in FIG. 15, the installation surface setting circuit 420 sets the back surface of the first object 1511 as the preset surface. Since the back surface of the first object 1511 is the preset surface, the installation candidate mark 1522 indicating the back surface of the first object 1511 is displayed in a display format different from that of other installation candidate marks 1521, and 1523 to 1526. For example, the installation candidate mark 1522 may be displayed blinkingly, displayed in a shape other than that of other installation candidate marks 1521, and 1523 to 1526, or displayed in a color other than that of other installation candidate marks 1521, and 1523 to 1526. Other installation candidate marks 1521, and 1523 to 1526 may be indicated by broken lines so as to indicate inactivation.

Then, the installation location determination circuit 426 determines the installation location of a wireless device based on the location corresponding to one point of the first image, and the location of the preset surface set by the installation surface setting circuit 420, according to a confirmation operation (S425) by the operator (S407). The operator may execute the confirmation operation by pressing a screen displayed on the display 13 when, for example, a confirmation signal indicating whether the selected surface may be set as a surface where the wireless device is to be arranged is input from the installation location determination circuit 426. The installation location determination circuit 426 determines coordinates indicating the location where the wireless device is to be installed, from an X coordinate and a Y coordinate corresponding to the point of the first image selected by the operator in the processing in S405, and a Z coordinate corresponding to the preset surface set by the installation surface setting circuit 420. The installation location determination circuit 426 stores the determined coordinates in the device table 402.

The processings in S408 to S412 are the same as the processings in S201 to S206, and thus detailed descriptions thereof will be omitted herein.

(Operational Effect of Information Processing Apparatus According to Third Embodiment)

The information processing apparatus according to the third embodiment may set a surface on which the wireless device is to be installed, in advance. Thus, it is possible to omit an operation of selecting a surface on which the wireless device is to be installed, by the second image including the installation candidate marks indicating selectable surfaces of a plurality of objects. In the information processing apparatus according to the third embodiment, it is possible to omit an operation of selecting a surface on which the wireless device is to be installed, by the second image, and thus an operation of determining the installation location of the wireless device becomes easier.

(Configuration and Function of Information Processing Apparatus of Executing Installation Location Determination Process, According to Fourth Embodiment)

FIG. 16A is a circuit block diagram of an information processing apparatus of executing an installation location determination process, according to a fourth embodiment, and FIG. 16B is a functional block diagram of a processor illustrated in FIG. 16A.

An information processing apparatus 4 is different from the information processing apparatus 1 in that the information processing apparatus 4 includes a processor 50 instead of the processor 20. The processor 50 is different from the processor 20 in that the processor 50 includes an installable surface determination circuit 51. The processor 50 is different from the processor 20 in that the processor 50 includes a device location determination circuit 52 instead of the device location determination circuit 22. The device location determination circuit 52 is different from the device location determination circuit 22 in that the device location determination circuit 52 includes a second image data generation circuit 523 instead of the second image data generation circuit 223. The configuration and function of the constituent elements of the information processing apparatus 4, except for the installable surface determination circuit 51 and the second image data generation circuit 523 are the same as those of the constituent elements of the information processing apparatus 1 denoted by the same reference numerals, and thus descriptions thereof will be omitted herein.

(Radio Wave Analysis Process by Information Processing Apparatus According to Fourth Embodiment)

Figure 17:
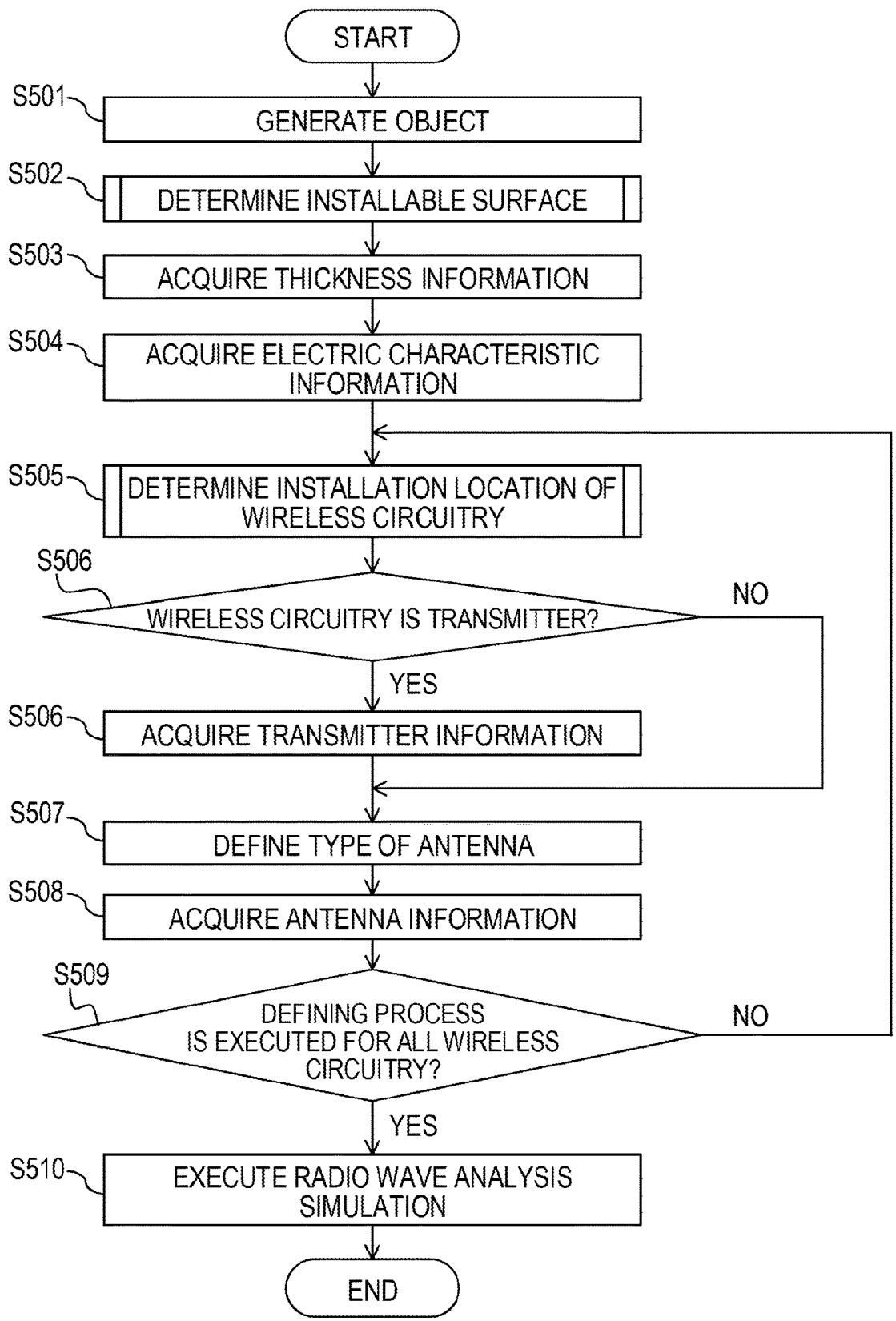
FIG. 17 is a flow chart of a radio wave analysis process by the information processing apparatus illustrated in FIGS. 16A and 16B.

FIG. 17 is a flow chart of a radio wave analysis process by the information processing apparatus 4. The radio wave analysis process illustrated in FIG. 17 is executed mainly by the processor 50 in cooperation with the respective components of the information processing apparatus 4, based on programs stored in advance in the memory 11.

The processings in S501, S503, S504, and S506 to S511 are the same as those in S101 to S103, and S105 to S110, and thus detailed descriptions thereof will be omitted herein. The installable surface determination circuit 51 determines whether each of the surfaces of the plurality of objects generated through the processing in S501 is a surface on which a wireless device is installable (S502). The device location determination circuit 52 determines an installation location where the wireless device is to be installed according to an operation of the input circuit 12 by the operator (S505). The device location determination circuit 52 stores the installation location determined through the processing in S505, in the device table 402 in association with a device ID.

(Installable Surface Determination Process by Information Processing Apparatus According to Fourth Embodiment)

Figure 18:
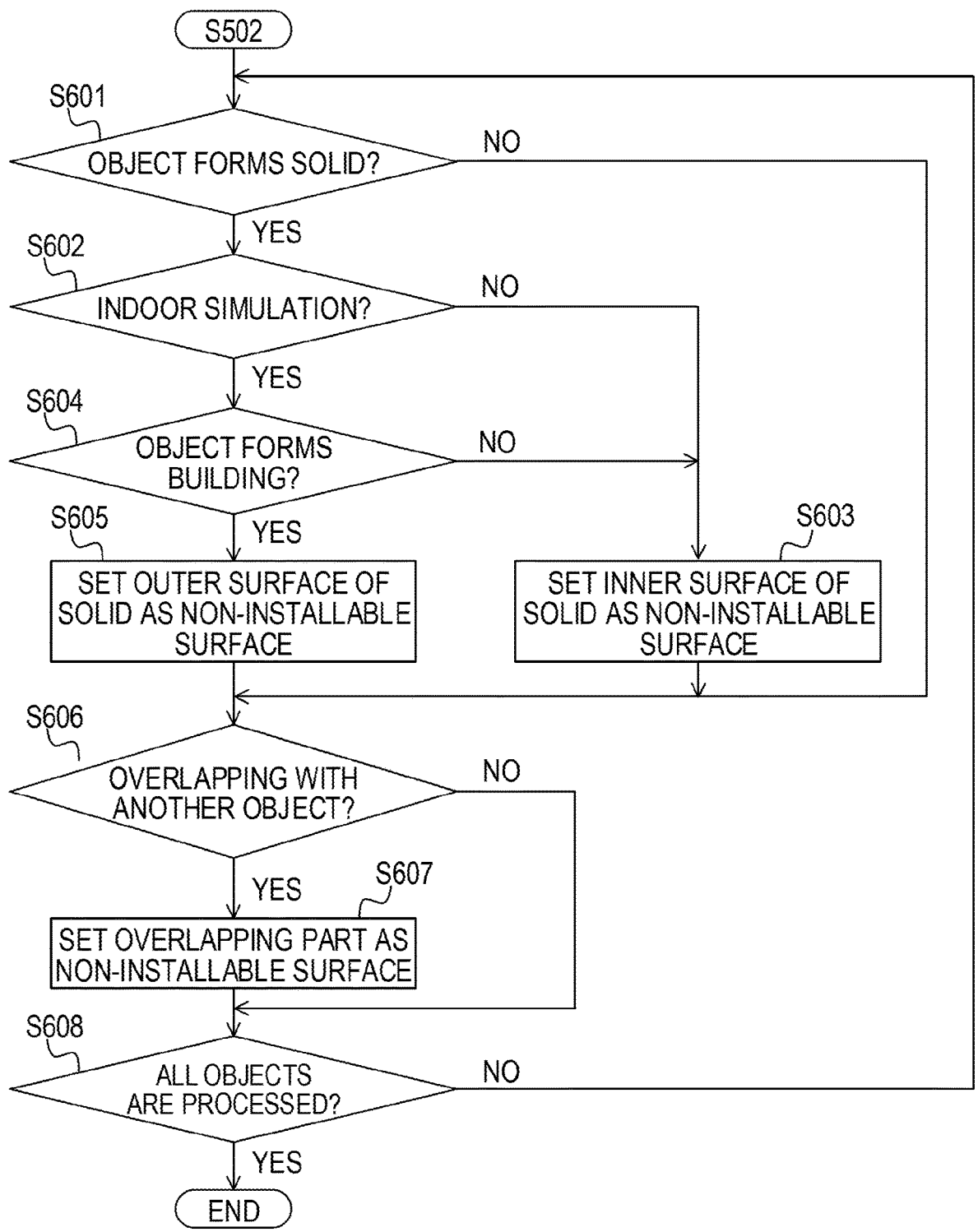
FIG. 18 is a more detailed flow chart of the processing described in S502 illustrated in FIG. 17.

FIG. 18 is a more detailed flow chart of the processing described in S502.

First, the installable surface determination circuit 51 determines whether a target object forms a solid together with other objects (S601). When all the four sides of a rectangular object are in contact with other objects, the installable surface determination circuit 51 determines that the target object forms a solid together with other objects. When the installable surface determination circuit 51 determines that the target object does not form a solid together with other objects (S601-NO), the processing proceeds to S606. Here, the shape of an object is assumed to be a rectangle, but the shape of the object may be a shape other than a rectangle, such as a triangle. In the information processing apparatus according to the embodiment, when all sides of an object are in contact with other objects, it may be determined that the object forms a solid together with other objects.

When it is determined that the target object forms a solid together with other objects (S601-YES), the installable surface determination circuit 51 determines whether a simulation to be executed is an indoor radio wave analysis simulation (S602). For the first object, the installable surface determination circuit 51 may display a screen used for determining whether the simulation to be executed is an indoor simulation, on the display 13, and may acquire information on whether the simulation is an indoor simulation. The installable surface determination circuit 51 stores the information on whether the simulation to be executed is an indoor simulation in the memory 11. For the second and subsequent objects, the installable surface determination circuit 51 may determine whether the simulation to be executed is an indoor simulation, based on the information stored in the memory 11.

When it is determined that the simulation to be executed is not an indoor radio wave analysis simulation (S602-NO), the installable surface determination circuit 51 sets an object surface corresponding to the inner surface of the formed solid, as a non-installable surface (S603). The installable surface determination circuit 51 estimates an object surface corresponding to the inner surface of the solid based on the extension direction of the target object and extension directions of other objects forming the solid. For example, the installable surface determination circuit 51 may estimate the surface surrounded by other four objects, as the inner surface of the solid, when other four objects in contact with four sides of the target object extend in the same direction perpendicular to one surface of the target object.

When it is determined that the simulation to be executed is an indoor radio wave analysis simulation (S602-YES), the installable surface determination circuit 51 determines whether the target object forms a building (S604). When there is no object facing one surface of the target object, the installable surface determination circuit 51 determines that the target object forms a building.

When it is determined that the target object forms a building (S604-YES), the installable surface determination circuit 51 sets the outer surface of the solid as a non-installable surface (S605). Meanwhile, when it is determined that the target object does not form a building (S604-NO), the installable surface determination circuit 51 sets the inner surface of the solid as a non-installable surface (S603). The installable surface determination circuit 51 estimates a surface not facing any object as an outer surface, and estimates a surface facing another object as an inner surface.

Subsequently, the installable surface determination circuit 51 determines whether any one of surfaces of the target object overlaps with a surface of another object (S606). By comparing coordinates of the target object with coordinates of another object, the installable surface determination circuit 51 determines whether any one of surfaces of the target object overlaps with another object surface.

When it is determined that any one of surfaces of the target object overlaps with another object surface (S606-YES), the installable surface determination circuit 51 sets the overlapping surface as a non-installable surface (S607).

Subsequently, the installable surface determination circuit 51 determines whether the processings in S601 to S607 have been executed for all objects (S608). Until it is determined that the processings in S601 to S607 have been executed for all objects (S608-YES), the installable surface determination circuit 51 repeats the processings in S601 to S608. When the installable surface determination circuit 51 determines that the processings in S601 to S607 have been executed for all objects (S608-YES), the process ends.

(Installation Location Determination Process by Information Processing Apparatus According to Fourth Embodiment)

FIG. 19A is a more detailed flow chart of the processing described in S505, and FIG. 19B is a more detailed flow chart of the processing in S703 illustrated in FIG. 19A.

The processings in S701 to S702, and S704 to S706 are the same as those in S201 to S202 and S204 to S206, and thus detailed descriptions thereof will be omitted herein. The processings in S711 to S713 are the same as those in S211 to S213, and thus detailed descriptions thereof will be omitted herein. The second image data generation circuit 523 generates second image data, and outputs the generated second image data to the display 13 (S703).

Specifically, the second image data generation circuit 523 determines whether an object surface positioned in the vertical direction in the display plane determined through the processing in S702 is a surface on which the wireless device is installable (S801). The second image data generation circuit 523 determines whether each of surfaces of the target object is a surface on which the wireless device is installable based on whether the surface is stored as a non-installable surface, with reference to the memory 11.

When it is determined that the target object surface is a surface on which the wireless device is installable (S801-YES), the second image data generation circuit 523 sets the surface determined to be the surface on which the wireless device is installable, as an installable surface (S802). Subsequently, the second image data generation circuit 523 determines whether the processings in S801 and S802 have been executed for all objects positioned in the vertical direction of the display plane determined through the processing in S702 (S803). Until it is determined that the processings in S801 and S802 have been executed for all objects positioned in the vertical direction (S803-YES), the second image data generation circuit 523 repeats the processings in S801 to S803.

When it is determined that the processings in S801 and S802 have been executed for all objects positioned in the vertical direction (S803-YES), the second image data generation circuit 523 generates second image data (S804). The second image corresponding to the second image data generated through the processing in S804 includes only installation candidate marks corresponding to surfaces determined to be surfaces on which the wireless device is installable, but does not include installation candidate marks corresponding to surfaces determined not to be surfaces on which the wireless device is installable. Then, the second image data generation circuit 523 outputs the generated second image data (S805).

Figure 20A:
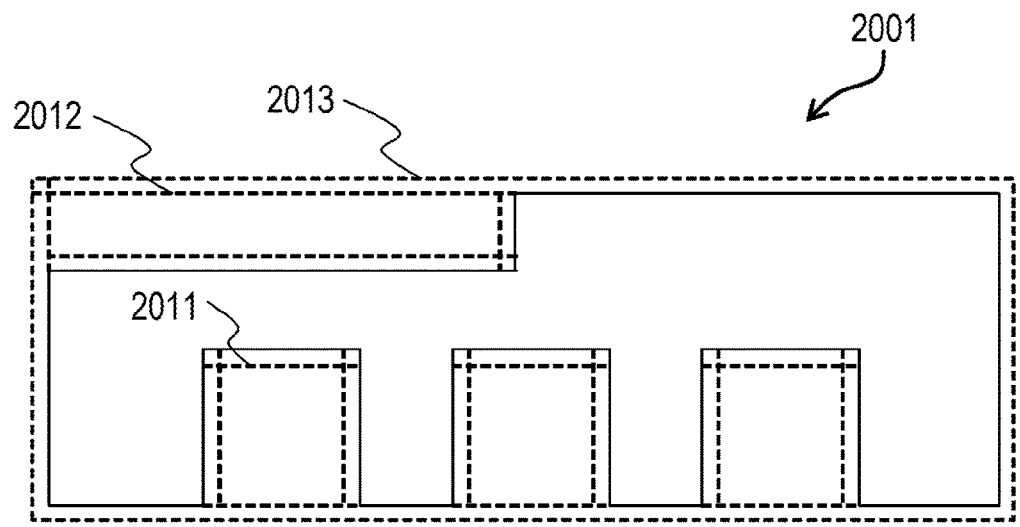
FIG. 20A is a view for explaining the processing in S502 illustrated in FIG. 17.
Figure 20B:
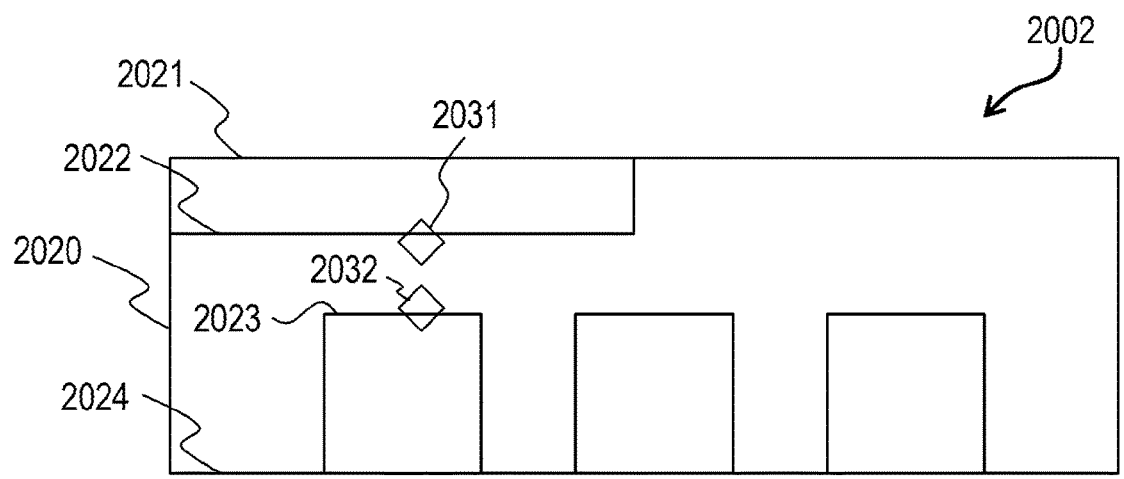
FIG. 20B is a view for explaining the processing in S505 illustrated in FIG. 17.

FIG. 20A is a view for explaining the processing in S502, and FIG. 20B is a view for explaining the processing in S505. In FIG. 20A, the surface set as a non-installable surface by the installable surface determination circuit 51 is indicated by a broken line, and the surface not set as a non-installable surface by the installable surface determination circuit 51 is indicated by a solid line.

In a building sectional view 2001, a surface 2011 is determined as an inner surface of a solid formed together with other objects, and thus is set as a non-installable surface. A surface 2012 is determined as a surface overlapping with another object surface, and thus is set as a non-installable surface. A surface 2013 is determined as an outer surface of a building, and thus is set as a non-installable surface.

A second image 2002 includes a display plane image 2020 formed of a plurality of objects each of which is indicated by a straight line, and installation candidate marks 2031 and 2032 arranged to be superimposed on a display plane image 2020 in FIG. 20B. The display plane image 2020 includes a first object 2021 indicating a ceiling, a second object 2022 indicating a lower surface of a member attached to the ceiling, a third object 2023 indicating an upper surface of a member arranged on a floor surface, and a fourth object 2024 indicating the floor surface.

The installation candidate mark 2031 corresponds to the back surface of the second object 2022 that is determined to be a surface on which the wireless device is installable by the second image data generation circuit 523. The installation candidate mark 2032 corresponds to the front surface of the third object 2023 that is determined to be a surface on which the wireless device is installable by the second image data generation circuit 523.

(Operational Effect of Information Processing Apparatus According to Fourth Embodiment)

In the information processing apparatus according to the fourth embodiment, the second image does not display an installation candidate mark corresponding to a surface on which the wireless device is not installable. Thus, an operation of determining the installation location of the wireless device, by the operator, becomes easier.

(Configuration and Function of Information Processing Apparatus of Executing Installation Location Determination Process According to Fifth Embodiment)

FIG. 21A is a circuit block diagram of an information processing apparatus of executing an installation location determination process, according to a fifth embodiment, and FIG. 21B is a functional block diagram of a processor illustrated in FIG. 21A.

An information processing apparatus 5 is different from the information processing apparatus 1 in that the information processing apparatus 5 includes a processor 60 instead of the processor 20. The processor 60 is different from the processor 20 in that the processor 60 includes a use mode determination circuit 61. The processor 60 is different from the processor 20 in that the processor 60 includes a device location determination circuit 62 instead of the device location determination circuit 22. The device location determination circuit 62 is different from the device location determination circuit 22 in that the device location determination circuit 62 includes a second image data generation circuit 623 instead of the second image data generation circuit 223. The configuration and function of the constituent elements of the information processing apparatus 5, except for the use mode determination circuit 61 and the second image data generation circuit 623, are the same as those of the constituent elements of the information processing apparatus 1 denoted by the same reference numerals, and thus, detailed descriptions thereof will be omitted herein.

(Radio Wave Analysis Process by Information Processing Apparatus According to Fifth Embodiment)

Figure 22:
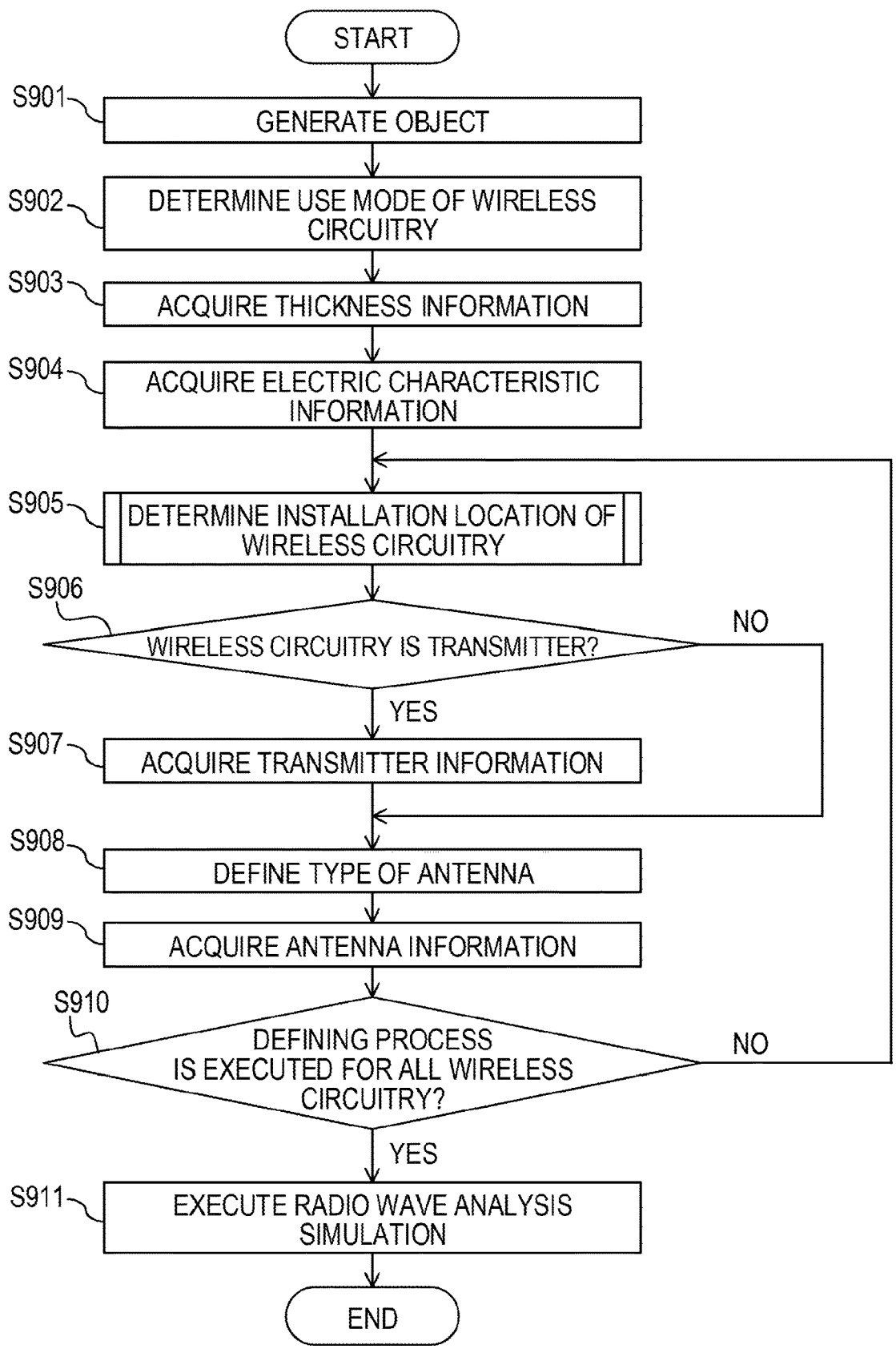
FIG. 22 is a flow chart of a radio wave analysis process by the information processing apparatus illustrated in FIGS. 21A and 21B.

FIG. 22 is a flow chart of a radio wave analysis process by the information processing apparatus 5. The radio wave analysis process illustrated in FIG. 22 is executed mainly by the processor 60 in cooperation with the respective components of the information processing apparatus 5, based on programs stored in advance in the memory 11.

The processings in S901, 903, S904, and S906 to S911 are the same as those in S101 to S103 and S105 to S110, and thus detailed descriptions thereof will be omitted herein. The use mode determination circuit 61 determines a mode for use of a wireless device for which the radio wave analysis simulation is to be executed, according to an operation of the operator (S902). For example, when a mode selection signal indicating a plurality of modes for use of the wireless device is input from the use mode determination circuit 61 such that the mode selection signal is selectable, the operator may execute a determination operation by pressing a screen displayed on the display 13. The use mode determination circuit 61 stores the determined use mode in the memory 11, in association with a corresponding application ID.

The device location determination circuit 62 determines an installation location where the wireless device is to be installed according to the operation of the input circuit 12 by the operator (S905). The device location determination circuit 62 stores the installation location determined through the processing in S905, in the device table 402 in association with a device ID.

(Installation Location Determination Process by Information Processing Apparatus According to Fifth Embodiment)

FIG. 23A is a more detailed flow chart of the processing described in S905, and FIG. 23B is a view illustrating an example of a second image.

The processings in S1001, S1002, and S1004 to S1006 are the same as the processings of S201, S202, and S204 to S206, and thus detailed descriptions thereof will be omitted herein. The processings in S1011 to S1013 are the same as those in S211 to S213, and thus detailed descriptions thereof will be omitted herein. The second image data generation circuit 623 generates second image data, and outputs the generated second image data to the display 13 (S1003).

The second image data generation circuit 623 acquires an application ID associated with the use mode determined by the use mode determination circuit 61, from the memory 11. The second image data generation circuit 623 acquires recommended installation surface information corresponding to the acquired application ID, with reference to the application table 405. Then, the second image data generation circuit 623 generates second image data indicating a second image that displays an installation candidate mark corresponding to the recommended installation surface information, in a display format different from that of other installation candidate marks.

A second image 2302 includes a display plane image 230 formed of a plurality of objects each of which is indicated by a straight line, and installation candidate marks 2321 to 2328 arranged to be superimposed on the display plane image 230 in FIG. 23B. The display plane image 230 includes a first object 2311 indicating a ceiling, a second object 2312 indicating a lower surface of a member attached to the ceiling, a third object 2313 indicating an upper surface of a member arranged on a floor surface, and a fourth object 2314 indicating the floor surface.

The installation candidate mark 2321 corresponds to the front surface of the first object 2311, and the installation candidate mark 2322 corresponds to the back surface of the first object 2311. The installation candidate mark 2323 corresponds to the front surface of the second object 2312, and the installation candidate mark 2324 corresponds to the back surface of the second object 2312. The installation candidate mark 2325 corresponds to the front surface of the third object 2313, and the installation candidate mark 2326 corresponds to the back surface of the third object 2313. The installation candidate mark 2327 corresponds to the front surface of the fourth object 2314, and the installation candidate mark 2328 corresponds to the back surface of the fourth object 2314.

The installation candidate mark 2322 is displayed in a display format different from that of other installation candidate marks 2321 and 2323 to 2328 so as to indicate that the installation candidate mark 2322 is a recommended installation surface. For example, the installation candidate mark 2322 may be displayed blinkingly, displayed in a shape other than that of other installation candidate marks 2321 and 2323 to 2328, or displayed in a color other than that of other installation candidate marks 2321 and 2323 to 2328. Other installation candidate marks 2321 and 2323 to 2328 may be indicated by broken lines so as to indicate that the installation candidate marks 2321 and 2323 to 2328 are not recommended installation surfaces.

(Operational Effect of Information Processing Apparatus According to Fifth Embodiment)

The information processing apparatus according to the fifth embodiment may set a surface that is recommended for the installation of the wireless device, in advance, according to a mode in which the wireless device is to be used. Thus, the operator may more easily determine the installation location of the wireless device.

(Modification of Information Processing Apparatus According to Embodiment)

Each of the information processing apparatuses according to the second embodiment to the fifth embodiment is described as a separate embodiment, but the information processing apparatus according to the embodiment may include two or more of respective characteristic parts of the information processing apparatuses according to the second embodiment to the fifth embodiment. For example, the information processing apparatus according to the embodiment may include characteristic parts of the information processing apparatuses according to the second embodiment, the third embodiment, and the fifth embodiment.

The information processing apparatus according to the third embodiment generates third image data indicating a third image that includes installation candidate marks corresponding to an automatically set object surface, but in the information processing apparatus according to the embodiment, the processing of generating the third image data may be omitted.

The above-described information processing apparatus according to the embodiment determines a display plane including one point that is clicked on a first image, but the information processing apparatus according to the embodiment may determine a plurality of display planes which include a plurality of points, respectively, included in a range-designated area. For example, the information processing apparatus according to the embodiment may determine a plurality of display planes such that as many wireless device as the number specified by the operator are included in the range-designated area. The information processing apparatus according to the embodiment may automatically arrange as many wireless device as the number specified by the operator, on an automatically set surface as described in the third embodiment.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. An information processing apparatus comprising:
   a memory that stores location information indicating locations of a plurality of first objects to be arranged within a three-dimensional space; and
   a processor coupled to the memory, configured to perform a process, the process including
   generating first image data indicating a first image including the plurality of first objects based on the location information;
   outputting the first image data to a display;
   determining a display plane including a location corresponding to one point of the first image, according to a first inputted selection instruction, the display plane including a plurality of second objects among the plurality of first objects included in the first image;

generating second image data indicating a second image which includes a display plane image and installation candidate marks;

outputting the second image data to the display, the display plane image including the plurality of second objects included in the display plane, and the installation candidate marks being arranged to be superimposed on the display plane image and first surfaces among surfaces of the plurality of second objects in the display plane image that are selectable as an installation location of a wireless device;

determining whether a first surface corresponding to any one of the installation candidate marks has been selected according to a second inputted selection instruction; and determining the installation location of the wireless device based on the location corresponding to the one point of the first image, and a location of the selected first surface.

2. The information processing apparatus according to claim 1, comprising:

the processor configured to generate third image data indicating a third image that displays a selected installation candidate mark in a display format different from a display format of other installation candidate marks, according to the second inputted selection instruction, and output the third image data to the display.

3. The information processing apparatus according to claim 1, comprising:

the second image further including a selection list indicating surfaces corresponding to the installation candidate marks.

4. The information processing apparatus according to claim 1, comprising:

the processor configured to determine a location corresponding to a given surface as the installation location of the wireless device when the given surface is defined as a surface on which the wireless device is to be installed.

5. The information processing apparatus according to claim 1, wherein the processor determines whether any one of the surfaces of the plurality of second objects is a surface on which the wireless device is installable, and the second image includes the installation candidate marks corresponding to surfaces determined as surfaces on which the wireless device is installable, and excludes the installation candidate marks corresponding to surfaces determined as surfaces on which the wireless device is non-installable.

6. The information processing apparatus according to claim 1, wherein the processor determines a mode in which the wireless device is to be used, and the second image displays at least one of the installation candidate marks in a display format different from a display format of other installation candidate marks, according to the determined mode for use of the wireless device.

7. An information processing method performed by a computer coupled to a memory that stores location information indicating locations of a plurality of first objects to be arranged within a three-dimensional space, the method comprising:

generating first image data indicating a first image including the plurality of first objects based on the location information;

outputting the first image data to a display;

determining a display plane including a location corresponding to one point of the first image, according to a first inputted selection instruction, the display plane including a plurality of second objects among the plurality of first objects included in the first image;

generating second image data indicating a second image which includes a display plane image and installation candidate marks;

outputting the second image data to the display, the display plane image including the plurality of second objects included in the display plane, and the installation candidate marks being arranged to be superimposed on the display plane image and first surfaces among surfaces of the plurality of second objects in the display plane image that are selectable as an installation location of a wireless device;

determining whether a first surface corresponding to any one of the installation candidate marks has been selected according to a second inputted selection instruction; and determining the installation location of the wireless device based on the location corresponding to the one point of the first image, and a location of the selected first surface.

8. A non-transitory computer-readable recording medium that stores therein a computer program for information process, the computer program enabling a computer to execute a process, the computer coupled to a memory that stores location information indicating locations of a plurality of first objects to be arranged within a three-dimensional space, the process comprising:

generating first image data indicating a first image including the plurality of first objects based on the location information;

outputting the first image data to a display;

determining a display plane including a location corresponding to one point of the first image, according to a first inputted selection instruction, the display plane including a plurality of second objects among the plurality of first objects included in the first image;

generating second image data indicating a second image which includes a display plane image and installation candidate marks;

outputting the second image data to the display, the display plane image including the plurality of second objects included in the display plane, and the installation candidate marks being arranged to be superimposed on the display plane image and first surfaces among surfaces of the plurality of second objects in the display plane image that are selectable as an installation location of a wireless device;

determining whether a first surface corresponding to any one of the installation candidate marks has been selected according to a second inputted selection instruction; and determining the installation location of the wireless device based on the location corresponding to the one point of the first image, and a location of the selected first surface.

* * * * *